United States Patent
Bolliger et al.

(10) Patent No.: US 12,174,280 B2
(45) Date of Patent: Dec. 24, 2024

(54) SYSTEM AND METHOD FOR PROVISIONAL TRAINING DATA TO ENABLE A NEURAL NETWORK TO IDENTIFY SIGNALS IN NMR MEASUREMENTS

(71) Applicant: Bruker Switzerland AG, Fällanden (CH)

(72) Inventors: Christine Bolliger, Benken (CH); Oliver Horlacher, Olten (CH); Jochen Klages, Zürich (CH); Irina Galiash, Adliswil (CH); Marco Glur, Zürich (CH); Fabrice Moriaud, Wallisellen (CH)

(73) Assignee: Bruker Switzerland AG, Fällanden (CH)

( * ) Notice: Subject to any disclaimer, the term of this patent is extended or adjusted under 35 U.S.C. 154(b) by 1013 days.

(21) Appl. No.: 17/247,609

(22) Filed: Dec. 17, 2020

(65) Prior Publication Data

US 2021/0192350 A1    Jun. 24, 2021

(30) Foreign Application Priority Data

Dec. 20, 2019  (EP) .................................. 19218443

(51) Int. Cl.
*G01R 33/56*  (2006.01)
*G01N 24/08*  (2006.01)
(Continued)

(52) U.S. Cl.
CPC ......... *G01R 33/5608* (2013.01); *G01N 24/08* (2013.01); *G06F 18/214* (2023.01); *G06N 3/08* (2013.01)

(58) Field of Classification Search
None
See application file for complete search history.

(56) References Cited

U.S. PATENT DOCUMENTS

| | | | | |
|---|---|---|---|---|
| 5,218,529 A | * | 6/1993 | Meyer | ...................... G06N 3/02 706/924 |
| 10,578,694 B2 | * | 3/2020 | Fischer | .............. G01R 33/4625 |

(Continued)

FOREIGN PATENT DOCUMENTS

EP    2508909 A2    10/2012

OTHER PUBLICATIONS

Anonymous: "Using Deep Learning for the Interpretation of NMR Spectra", ISMAR EUROMAR Joint Conference, Berlin, Germany, Aug. 25, 2019, XP055705871, Retrieved from the Internet: URL:https://www.bruker.com/fileadmin/user_upload/5-Events/2019/88IO/EUROISMAR/Deep-Learning-Applications-in-NMR-lowres.pdf [retrieved on Jun. 17, 2020].

(Continued)

*Primary Examiner* — Lina Cordero
(74) *Attorney, Agent, or Firm* — Brake Hughes Bellermann LLP

(57) ABSTRACT

Training a neural network for signal analysis in NMR spectra may use a plurality of computed NMR raw spectra, each raw spectrum being associated with a different NMR active molecule having a known number of protons (#P). Peaks of the raw spectra may be broadened to generate a broadened spectrum for each raw spectrum. For each broadened spectrum, its integral function may be computed to count the number of protons associated with peaks of the respective broadened spectrum. Signal intervals may be identified as intervals in the broadened spectrum where the integral function increases approximately by multiples of the value associated with a single proton so that the total number of counted protons matches the known number of protons (#P) of the associated molecule. The obtained spectra with associated labels for the identified signal intervals are provided as the training data set to the neural network.

20 Claims, 14 Drawing Sheets

(51) Int. Cl.
  *G06F 18/214* (2023.01)
  *G06N 3/08* (2023.01)

(56) References Cited

U.S. PATENT DOCUMENTS

2009/0051360 A1* 2/2009 Sakhaii ............ G01R 33/4633
　　　　　　　　　　　　　　　　　　　　　　324/307
2019/0391219 A1* 12/2019 Fischer ............ G01R 33/4625

OTHER PUBLICATIONS

Bhat H et al: "Fast quantification of proton magnetic resonance spectroscopic imaging with artificial neural networks", Journal of Magnetic Resonance, Academic Press, Orlando, FL, US, vol. 183, No. 1, Nov. 1, 2006, pp. 110-122, XP024919421.

Dicheng Chen et al: "Review and Prospect: Deep Learning in Nuclear Magnetic Resonance Spectroscopy", arxiv.org, Cornell University Library, 201 Olin Library Cornell University Ithaca, NY 14853, Jan. 13, 2020, XP081636389.

Hiltunen Y et Al: "Quantification of Human Brain Metabolites from in Vivo"1 H NMR Magnitude Spectra Using Automated Artificial Neural Network Analysis, Journal of Magnetic Resonance, Academic Press, Orlando, FL, US, vol. 154, No. 1, Jan. 1, 2002, pp. 1-5, XP004406481.

Hyeong Hun Lee et al: "Intact metabolite spectrum mining by deep learning in proton magnetic resonance spectroscopy of the brain", Magnetic Resonance in Medicine., vol. 82, No. 1, Mar. 12, 2019, pp. 33-48, XP055705988.

Nima Hatami et al: "Magnetic Resonance Spectroscopy Quantification using Deep Learning", arxiv.org, Cornell University Library, 201 Olin Library Cornell University Ithaca, NY 14853, Jun. 19, 2018 (Jun. 19, 2018), XP080892244.

Santosh Kumar Bharti et al: "Quantitative 1 H NMR spectroscopy", Trac Trends in Analytical Chemistry, vol. 35, May 1, 2012, pp. 5-26, XP055167863.

* cited by examiner

SYSTEM AND METHOD FOR PROVISIONAL TRAINING DATA TO ENABLE A NEURAL NETWORK TO IDENTIFY SIGNALS IN NMR MEASUREMENTS

CROSS-REFERENCE TO RELATED APPLICATIONS

This application claims priority to European Patent Application No. EP19218443.0, filed on Dec. 20, 2019, the contents of which are incorporated herein by reference.

TECHNICAL FIELD

The present description generally relates to signal detection in NMR spectroscopy and more particularly to the generation of training data for a neural network to enable the neural network to identify signal intervals in spectra obtained from real-world NMR spectroscopy experiments.

BACKGROUND

Nuclear magnetic resonance (NMR) spectroscopy is a spectroscopic technique to observe molecular properties at atomic level. When a sample is placed in a magnetic field, local magnetic fields are induced around the atomic nuclei. These induced fields can be observed by applying radio frequency (RF) pulses to the sample and monitoring the response which is the NMR signal. This NMR signal is picked up by sensitive RF receivers. The locally induced fields are specific to the molecular environment of the atomic nuclei, thus giving access to details of the electronic structure of a molecule and its individual functional groups. For example, NMR spectroscopy is used to identify organic compounds, proteins and other complex molecules. Besides identification, NMR spectroscopy provides detailed information about the structure, dynamics, reaction state, and chemical environment of molecules. Common types of NMR are proton and carbon-13 NMR spectroscopy, but it is applicable to any kind of sample that contains nuclear spins with a nuclear magnetic moment larger than zero. In this document, molecules which give rise to an NMR signal are referred to as NMR active molecules or NMR active substances.

Upon excitation of the sample with a radio frequency (typically 60-1000 MHz) pulse, a nuclear magnetic resonance response is obtained which is referred to as free induction decay (FID). The FID is a very weak signal and requires sensitive RF receivers to pick up. A Fourier transform can be applied to extract the frequency-domain spectrum from the raw time-domain FID. A spectrum from a single FID typically has a low signal-to-noise ratio, therefore usually multiple FIDs are acquired and averaged in order to obtain a spectrum with a better signal-to-noise ratio. Decay times of the response to the excitation, typically measured in seconds, depend on the effectiveness of relaxation, which is faster for lighter nuclei and in solids, and slower for heavier nuclei and in solutions whereas they can be very long in gases.

The evaluation of NMR spectra is typically supported by human NMR experts based on their experience with regards to how to interpret certain peaks in an NMR spectrum obtained from a real-world NMR experiment. A major task thereby is to identify which signal intervals in the obtained spectra are associated with peaks that are characteristic of the molecules in the NMR sample which is subject to evaluation. Such characteristic signal intervals may be difficult to identify because the signal of a typical NMR experiment includes signal contributions caused by sources different from the active molecule itself, such as for example, impurities, phase shifts, baseline effects, noise etc. The identification of the signal intervals is therefore an error prone procedure which depends a lot on the subjective individual experience of the supporting expert.

SUMMARY

There is therefore a need for systems and methods that provide a more robust and objective identification of signal intervals in NMR spectra obtained from real-world NMR experiments. Further, to enable computer-implemented algorithms to automatically interpret NMR spectra, for example, to verify the structure of a molecule based on its 1H NMR spectrum, requires in a first step the reliable identification of signal regions.

Example embodiments as claimed in the independent claims in the form of a computer-implemented method, computer system and computer program product solve this technical problem using the claimed features. It is to be noted that NMR responses are typically analyzed in the frequency domain. A signal interval, as used herein, refers to a frequency interval which is centered around the peak frequency of a respective signal peak in the NMR spectrum and characterizes a part of the spectrum which is associated with a nuclear magnetic resonance response of the NMR active molecules in response to a radio frequency pulse. Such signal intervals are sometimes also referred to as signal regions in literature. It is to be noted that in NMR spectroscopy the relative distance of the center frequency of a resonance peak from an arbitrarily chosen reference frequency (standard frequency) is called the chemical shift. A typical reference frequency which is frequently used is the frequency of the resonance peak of Tetramethylsilane (TMS). The reference frequency is thereby assigned to the chemical shift value "zero". The chemical shift is independent of the base frequency of the spectrometer and is measured in units of "ppm". In the following description and figures, the frequency values in NMR spectra are also referred to as ppm-values on a corresponding ppm scale.

In one embodiment, a computer-implemented method generates a realistic training data set for training a neural network to be used for signal analysis in NMR spectra, advantageously in liquid state 1H NMR spectra. Thereby, the initial hurdle for signal analysis is to identify the signal intervals (or signal regions). The data set provided by the claimed method is optimized to train the neural network to automatically identify such signal intervals in real-world NMR spectra with a high level of accuracy without any human interaction. In other words, the training data set can be considered realistic in the sense that it enables the training of the network with computed spectra that have a high similarity with NMR spectra obtained from real world experiments.

In an initial step, a plurality of computed NMR raw spectra is obtained. Each raw spectrum is thereby associated with a different NMR active molecule (also referred to as active molecule hereinafter) having a known number of protons. The plurality of computed NMR raw spectra may include exactly one raw spectrum for each active molecule. There are commercial tools available which compute a particular raw spectrum by obtaining the spin system of the associated NMR active molecule and a subsequent numerical solution of the Schroedinger equation for a given pulse sequence. An example of such a tool is the PERCH spectral simulator provided by PERCH Solutions Ltd., Kuopio, Finland. The PERCH spectral simulator is based on quantum mechanical calculation. Large spin-systems are packed using X-approximation.

A computer system which is configured to execute the computer-implemented method may include such a tool as an integrated component or it may be communicatively coupled with such a tool and receive the plurality of computed NMR raw spectra via a corresponding interface. A molecule database may serve as a reservoir of molecule descriptions. An example of such a database is PubChem which is a database of chemical molecules and their activities against biological assays. The system is maintained by the National Center for Biotechnology Information (NCBI), a component of the National Library of Medicine, which is part of the United States National Institutes of Health (NIH). PubChem can be accessed for free through a web user interface. From such molecule descriptions the number of protons in a corresponding molecule is known. From this reservoir, a subset of NMR active molecules serves as the input for a raw spectrum generator module implemented, for example by the previously mentioned PERCH tool. The subset may include only molecules having a structure not exceeding a predefined degree of complexity. Advantageously, the molecular weight of the associated NMR active molecules is smaller or equal to 500 Dalton for a neural network which is used with a focus to analyze NMR spectra of active molecules used for pharmaceutical applications. Typically, in pharmaceutical applications such smaller molecules are in focus.

The output of the raw spectrum generator is a respective raw spectrum for each NMR active molecule with the peaks that are expected as nuclear magnetic resonance response of the corresponding active molecule (after having been subject to a radio frequency pulse sequence). For example, all raw spectra may be computed with the same line width parameter. The line width parameter may be chosen so that the resulting line width corresponds to the lower end of a line width range including line widths which are typically obtained in a plurality of real-world NMR measurements.

In a broadening step, peaks of the received raw spectra are broadened by convolution of each raw spectrum with one or more line shaping functions to generate a broadened spectrum as a current spectrum for each raw spectrum. This broadening step is sometimes also referred to as line broadening. Examples of typical line shaping functions are Lorentzian and/or Gaussian functions. For example, a raw spectrum may be convoluted with a Lorentzian and/or a Gaussian function. A convolution of a Lorentzian function with a Gaussian function is also known as Voigt function. A different line broadening value may be used for each raw spectrum. For example, the range of used line broadening values may be equivalent to the range from 0.3 Hz to 0.6 Hz. Advantageously, the different line broadening values are applied to the plurality of raw spectra in accordance with a statistical distribution, such as for example, a Gamma or Beta distribution. An advantageous example uses a Gamma distribution with shape parameter 4 and scale parameter 0.15 for both the Gaussian and Lorentzian line broadening parameter. Other statistical distributions may be used as well by a person skilled in the art. The broadening value is approximately the value which is added to the line width of a raw spectrum by the line broadening convolution. The line broadening values applied to the various raw spectra are thereby sampled from the statistical distribution. In other words, the effect of the Gaussian and/or the Lorentzian line broadening on the plurality of the current spectra follows the used statistical distribution. For example, when using the above described Gamma distribution, 99% of current spectra would be broadened by a line broadening value between 0.10 Hz and 1.65 Hz (and 75% between 0.28 Hz and 0.95 Hz, respectively). In other words, the statistical variation of the broadening values applied to the raw spectra results in a statistical variation of the line widths in the broadened spectra. There is no need to generate multiple broadened spectra with different line widths for the same active molecule. Rather, it is sufficient to have one broadened spectrum for each active molecule where the different broadened spectra as a whole cover the entire range of line widths observed in real-world NMR experiments. The line broadening step results in current spectra which already show a significantly higher similarity with NMR spectra obtained from real-world NMR experiments than the originally computed raw spectra. A typical line broadening is 0.9 Hz and thus a typical line width is 1.5 Hz (when using the Gamma distribution mentioned above for both the Gaussian and Lorentzian line broadening parameters) for a raw spectrum that was simulated with a line width of 0.6 Hz.

Advantageously, for further processing, the received plurality of computed NMR raw spectra may be pre-processed so that the number of data points in each raw spectrum approximately corresponds to the number of data points of a comparable real-world NMR spectrum obtained from a real-world NMR experiment.

For each broadened spectrum signal intervals are now determined based on the computation of the indefinite integral function for a respective broadened spectrum to count the number of protons associated with peaks of the respective broadened spectrum. The computer system identifies signal intervals as such intervals in the broadened spectrum where the indefinite integral increases approximately by multiples of the value associated with a single proton. Because the broadened spectra at this stage are not disturbed by impurities, noise or any other perturbations, each peak or peak cluster in the broadened spectrum is clearly associated with an expected NMR response of the associated active molecule. The indefinite integral function is computed for the entire broadened spectrum which was scaled such that the finite integral over the whole spectrum matches the known number of protons of the associated molecule. The initially identified intervals are finally adjusted to cover at least a predefined threshold value of the corresponding known number of protons. Experiments have shown that a threshold value of at least 95% of the number of protons is leading to good results. In other words, the signal interval for a particular peak cluster is adjusted so that the start and end frequencies of the interval are symmetrically set in relation to the peak maximum frequency so that the integral value between the adjusted start and end frequencies still include an integral area which covers an area equal to or larger than the predefined threshold value of the corresponding number of protons. For example, if the integral increases by 1.8 times the value associated with a single proton, the system recognizes that the increase actually should correspond to 2.0 times the value associated with a single proton. Assuming a threshold value of 95%, the system would adjust the size of the signal interval to include an area corresponding to 1.9 times the value associated with a single proton.

The identified signal intervals in a particular broadened (current) spectrum represent labels associated with the respective signal intervals for the current spectrum. Once such labels have been determined for all current spectra, the current spectra are provided together with the associated labels as the training data set to the neural network to train the neural network for automatic identification of signal intervals in real-world NMR spectra.

It is to be noted that the labeling is performed completely automatically by the computer system executing said computer-implemented method without any need for human interaction. Further, the start and end frequencies of the labels are determined by the system with a very high degree of accuracy because the claimed integration method applied to the broadened spectra is not affected by any perturbations as they are found in real-world NMR spectra and therefore allows a highly accurate positioning of the start and end of the corresponding signal peak or peak clusters. Because of the statistical variation of the line widths in the plurality of current spectra, the neural network learns to generalize across all kinds of line widths occurring in real-world NMR experiments and at the same time learns to objectively identify the start and end of signal intervals with high accuracy.

In optional embodiments, the training data set may be further improved in the sense that perturbations which are present in NMR spectra obtained from real-world NMR experiment are also added to the computed broadened spectra. The term "current spectrum" as used herein always refers to the current state of a computed spectrum that is reached after the original raw spectrum has passed one or more post-processing steps. Therefore, a broadened spectrum is a current spectrum because the original raw spectrum has passed the pre-processing step of broadening. A current spectrum may then be modified by further post-processing steps.

After each post-processing step, a new (or modified) current spectrum is obtained. For the reason to keep the language simple, any new (or modified) current spectrum is also referred to as "current spectrum" herein. A person skilled in the art will recognize the state of the current spectrum based on the post-processing steps which have been applied to the original raw spectrum. After each post-processing step, a plurality of current spectra is obtained which can serve as the training data set.

In general, the post-processing steps which may be applied to the current spectra after having determined the signal intervals, apply one or more statistical modifications to each current spectrum wherein statistical parameters of a particular statistical modification are statistically distributed over the plurality of current spectra. Such statistical modifications add perturbations to the current spectra which modify the computed current spectra to become even more similar to real-world NMR spectra leading to a higher degree of recognition of signal intervals by the neural network when being trained with the perturbed current spectra.

In one embodiment, the applied perturbation is adding the effect of impurities to the current spectra. That is, a real-world NMR sample always includes impurities besides the active molecule to be analyzed. Such impurities also cause peaks in the real-world NMR spectrum obtained from such a sample. The impurities may be statistically selected from a list of known impurities. Examples of such impurities are Ethyl acetate or Cyclohexane. Impurities may also be randomly constructed impurities. Typically, known impurities are associated with known patterns in the corresponding spectrum whereas random impurities include regular and irregular patterns with a random number of lines/peaks. The spectra which will finally serve as training spectra for the neural network need to focus on the relevant signals which stem from the active molecule. There is no intention to train the network to identify impurities. Therefore, the concentration of added impurities is kept relatively low so that the impurity contribution to the integral of a particular current spectrum stays below the integral equivalent of, for example, 0.5 protons per impurity. As long as the integrated amplitude of impurity related peaks stays below the area which preferably is the equivalent of 0.5 protons, no signal regions is created because the threshold for being interpreted a multiple value associated with a single proton is not reached. Parameters characterizing the impurities comprise the number of impurities, the corresponding shift and the amplitude. Such parameters are statistically varied over the plurality of current spectra to which the impurity effect is added to. That is, similar as in the case of the statistical variation used for line broadening, each of said parameters is varied in accordance with a statistical distribution leading to current spectra with each spectrum reflecting a particular combination of parameters in accordance with said statistical parameter distributions.

In one embodiment, the applied perturbation is adding a linear phase shift to each current spectrum wherein the applied linear phase shifts are statistically distributed over the plurality of current spectra. In the model for the phase shift it is assumed that it only includes a term of zero order and a term of first order. The coefficients of the terms are again subject to a statistical distribution. For example, coefficients may be selected to result in a typical phase shift of maximal four degrees over the entire bandwidth. For each active molecule the linear phase shift is computed and applied in accordance with the given statistical distributions. Again, because of the statistical variation of the coefficients over all current spectra it is sufficient to have only one current spectrum for a given combination of coefficients in the training dataset because the neural network can already learn a generalization for the phase shift perturbation from such a training data set.

In one embodiment, the applied perturbation is adding a baseline variation to each current spectrum. The baseline variation for a particular current spectrum is computed with a piece-wise polynomial interpolation function through three to twelve sampling points (so-called knots), and wherein the coordinates of the knots for the current spectra are statistically evenly distributed over the plurality of current spectra. For example, the interpolation function may be a cubic spline function. The number of the sampling points may be determined by statistically selecting the number from a uniform distribution between a minimal value of 3 and a maximal value of 12. The x- and y-coordinates of the knots of the baseline variation are taken from a uniform distribution of the x- and y-coordinates over a predefined range. Thereby, the x-coordinate is evenly distributed over the entire spectral range of the corresponding current spectrum, and the y-coordinate is evenly distributed over a predefined range including positive and negative values. The determined knots are then fit with a cubic spline. Finally, the y-axis is scaled so that the average absolute deviation of the baseline from the zero level follows a uniform distribution.

In one embodiment, the applied perturbation is adding noise to each current spectrum wherein the noise amplitudes follow a Gaussian distribution and the standard deviation of the Gaussian distribution statistically varies over the plurality of current spectra.

Each perturbation turns the current spectrum into a spectrum which gets closer to a real-world spectrum as it can be expected from a real-world NMR experiment. It is to be noted that the added perturbations may overlay the broadened peaks of the broadened spectra. However, the labels indicating the signal intervals are still associated with the modified current spectra and, therefore, each current spectrum of the training data set provides the information about the exact locations of the signal intervals in the perturbed spectra.

In one embodiment, the provided current spectra of the training data set are now actually used for training the neural network for signal analysis in NMR spectra to enable the neural network to identify signal intervals in real-world NMR spectra obtained from real-world NMR experiments. The neural network may be part of the same computer system which is used for generation of the training data set, or it may be trained on a remote system which is communicatively coupled with this system. The neural network receives the current spectra of the generated training data set together with the labels for the identified signal intervals. A supervised learning method is used to train the neural network with the received current spectra of the training data set and with the associated label identifiers. Thereby, the received current spectra serve as inputs to the neural network and the respective signal intervals as indicated in the associated labels are used as outputs.

In one embodiment, the trained neural network is then used for signal analysis in real-world NMR spectra. The trained neural network receives a real-world NMR spectrum obtained from a real-world NMR experiment as test input. Then, the trained neural network is applied to said test input. As a result, the trained neural network provides as output one or more signal intervals as identified in the received test input.

It has been shown that the neural network which is trained with a training dataset according to any of the embodiments disclosed herein learns to generalize across the whole range of statistically varied parameters even if only a single current spectrum per active molecule is included in the training dataset. Even when all computed raw spectra were simulated at a proton resonance frequency of 400 MHz, the trained neural network is able to identify signal intervals with a high level of accuracy in real-world NMR spectra obtained from NMR spectrometers which were operated at proton resonance frequencies between 300 MHz and 500 MHz.

In one embodiment, a computer program product is provided for generating a realistic training data set for training a neural network for signal analysis in NMR spectra. The computer program product has instructions that when loaded into a memory of a computer system and being executed by at least one processor of the computer system cause the computer system to perform the method steps according to any of the herein disclosed embodiments of the computer implemented method for generating the training data set.

In one embodiment, a computer program product is provided for training a neural network for signal analysis in NMR spectra to enable the neural network to identify signal intervals in real-world NMR spectra obtained from real-world NMR experiments. The computer program product has instructions that when loaded into a memory of a computer system and being executed by at least one processor of the computer system to receive the training data set as generated in accordance with the disclosure herein, and to train the neural network with the received current spectra of the training data set and the associated label identifiers using a supervised learning method, wherein the training input to the neural network are the current spectra of the training data set and the outputs are the respective signal intervals.

In one embodiment, a computer program product is provided for signal analysis in NMR spectra to identify signal intervals in real-world NMR spectra obtained from real-world NMR experiments. The computer program product has instructions that when loaded into a memory of a computer system and being executed by at least one processor of the computer system cause the computer system to receive a real-world NMR spectrum obtained from a real-world NMR experiment as test input for the neural network as trained in accordance with the herein disclosed training method, and to apply the trained neural network to said test input, and to provide as output of the trained neural network one or more signal intervals as identified by the trained neural network.

In one embodiment, a computer system is provided for generating a realistic training data set for training a neural network for signal analysis in NMR spectra. The system has modules adapted to perform the corresponding steps when executing the above computer program product generating a realistic training data set for training said neural network.

In one embodiment, a computer system is provided for training a neural network for signal analysis in NMR spectra to enable the neural network to identify signal intervals in real-world NMR spectra obtained from real-world NMR experiments. The system has modules adapted to perform the corresponding steps when executing the above computer program product for training said neural network.

In one embodiment, a computer system is provided for signal analysis in NMR spectra to identify signal intervals in real-world NMR spectra obtained from real-world NMR experiments. The system has modules adapted to perform the corresponding steps when executing the above computer program product for signal analysis in NMR spectra.

Further aspects of the invention will be realized and attained by means of the elements and combinations particularly depicted in the appended claims. It is to be understood that both, the foregoing general description and the following detailed description are exemplary and explanatory only and are not restrictive of the invention as described.

DETAILED DESCRIPTION

Figure 1:
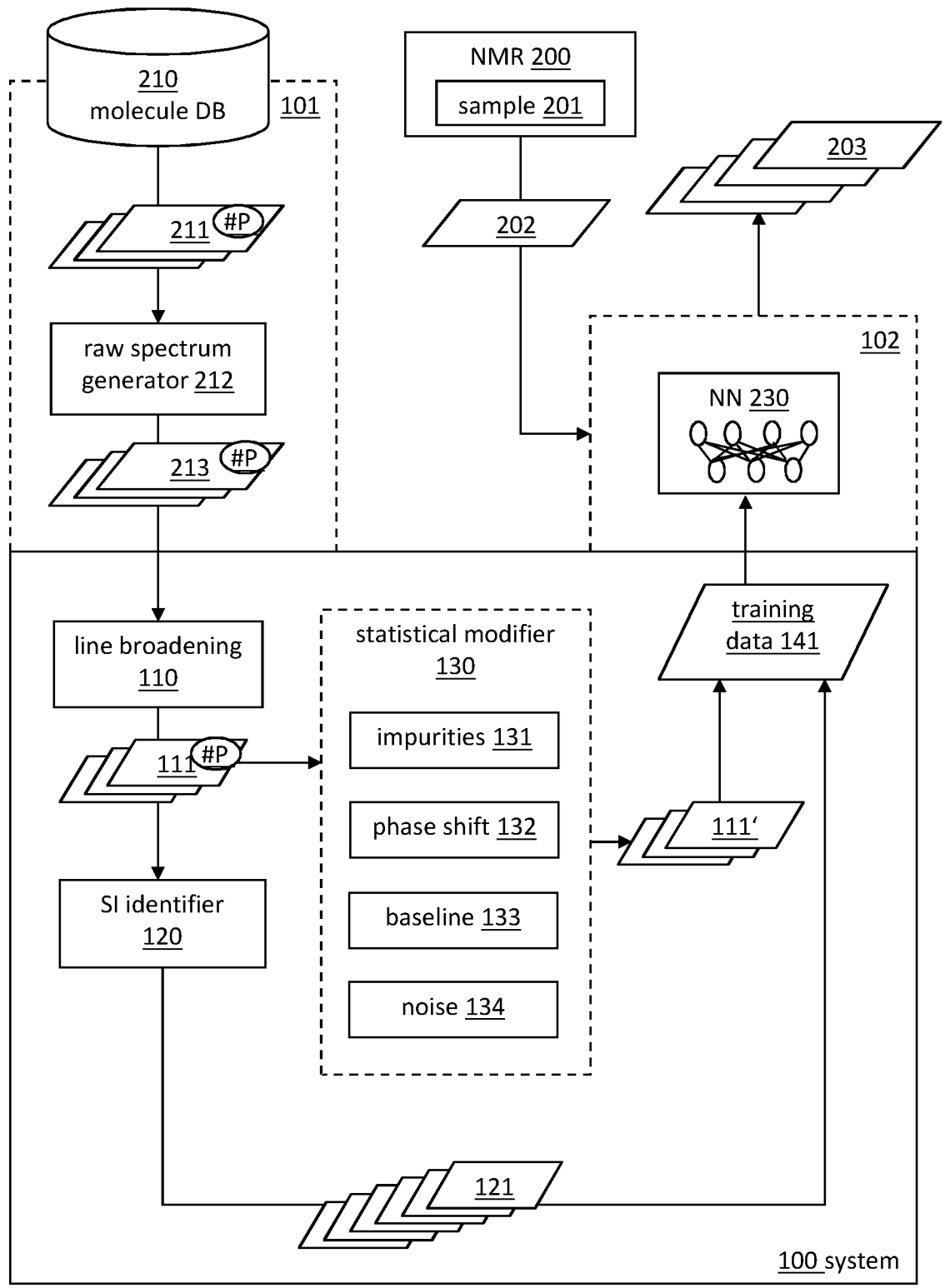
FIG. 1 includes a block diagram of a computer system for generating a realistic training data set for training a neural network for signal analysis in NMR spectra according to an embodiment, the computer system coupled to a spectrum generator tool and a neural network implementation.
Figure 2:
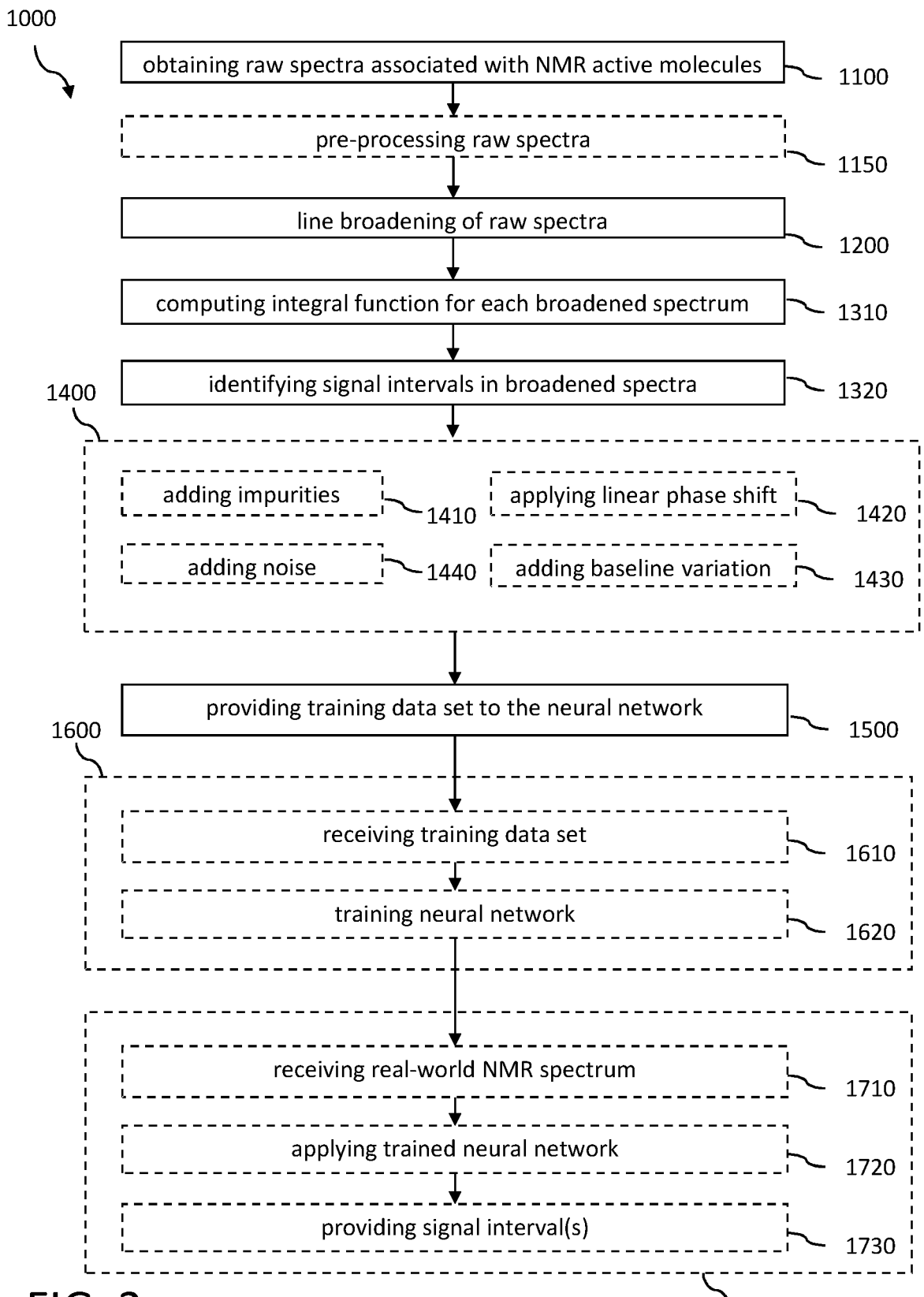
FIG. 2 is a simplified flow chart of a computer-implemented method for generating a realistic training data set with optional training and analysis steps according to various embodiments.

FIG. 1 illustrates a block diagram of a computer system 100 for generating a realistic training data set 141 for training a neural network 230 for signal analysis in NMR spectra according to an embodiment. The system 100 of FIG. 1 is described in the context of the simplified flow chart of a computer-implemented spectroscopic method 1000 for generating such a realistic training data set as illustrated in FIG. 2. Therefore, the following description refers to reference numbers used in FIG. 1 and FIG. 2. The system 100 is thereby configured to execute the method 1000 when loading a respective computer program into a memory of the system and executing said program with processing means of the system.

In the example embodiment of FIG. 1, an input to the computer system 100 is provided by a spectrum generator 101. The generator 101 can be implemented as an integral module of the computer system 100 or it may be provided as a standalone tool provided on a remote computer device which is communicatively coupled with the computer system 100. In both cases, standard communication means are used to provide data generated by the generator 101 to the computer system 100. The training dataset 141 is provided to the neural network 230 which is part of an NMR spectrum analyzer 102. Also the spectrum analyzer 102 may be an integral module of the computer system 100 or it may be operated on a remote computing device which is communicatively coupled with the computer system 100.

Figure 3:
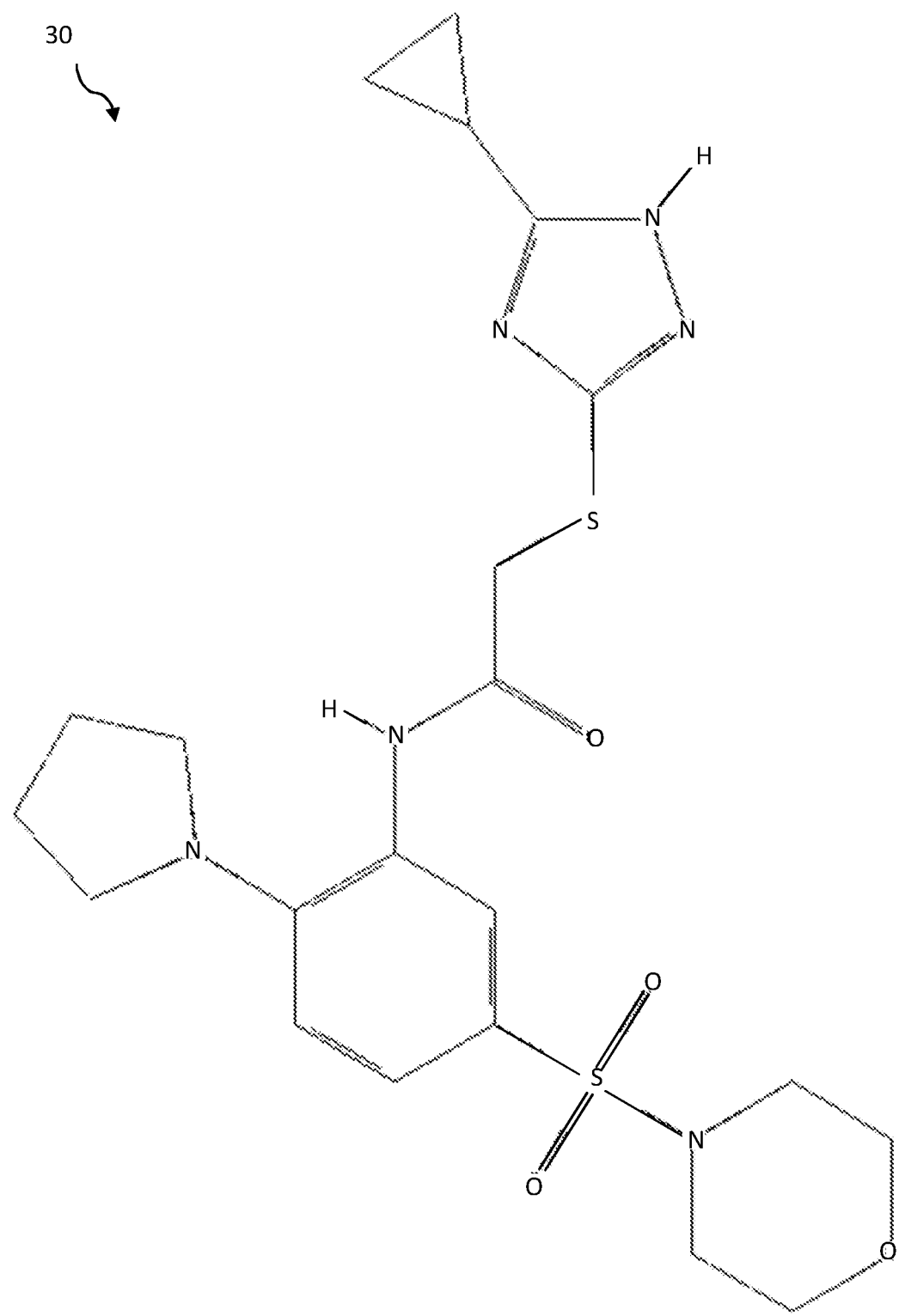
FIG. 3 illustrates an example of an NMR active molecule serving as a basis for raw spectrum generation.

The generator 101 is communicatively coupled with a molecule database (DB) 210. This molecule DB may be part of the generator itself, or more likely, it may be a remote database which can be accessed by the generator 101 through respective interfaces. The molecule DB provides a reservoir of molecule descriptions. An example of such a database is the PubChem database mentioned above. From such molecule descriptions the number of protons in a corresponding molecule is known. From this reservoir, a subset of NMR active molecules 211 serves as the input for a raw spectrum generator module 212 implemented, for example by the previously mentioned PERCH spectral simulator. The subset may include only molecules having a structure not exceeding a predefined degree of complexity. Advantageously, the molecular weight of the associated NMR active molecules is smaller or equal to 500 Dalton. FIG. 3 shows an example of a structural formula 30 of an NMR active molecule with 28 hydrogen atoms ($C_{21}H_{28}N_6O_4S_2$). This structural formula 30 is included in the PubChem database with the identifier CID 16587030. To train a reliable neural network a multitude of NMR active molecules fulfilling the above conditions is selected. For example, the number of selected molecules may be in the range of 100.000 to 10.000.000 NMR active molecules.

Figure 4:
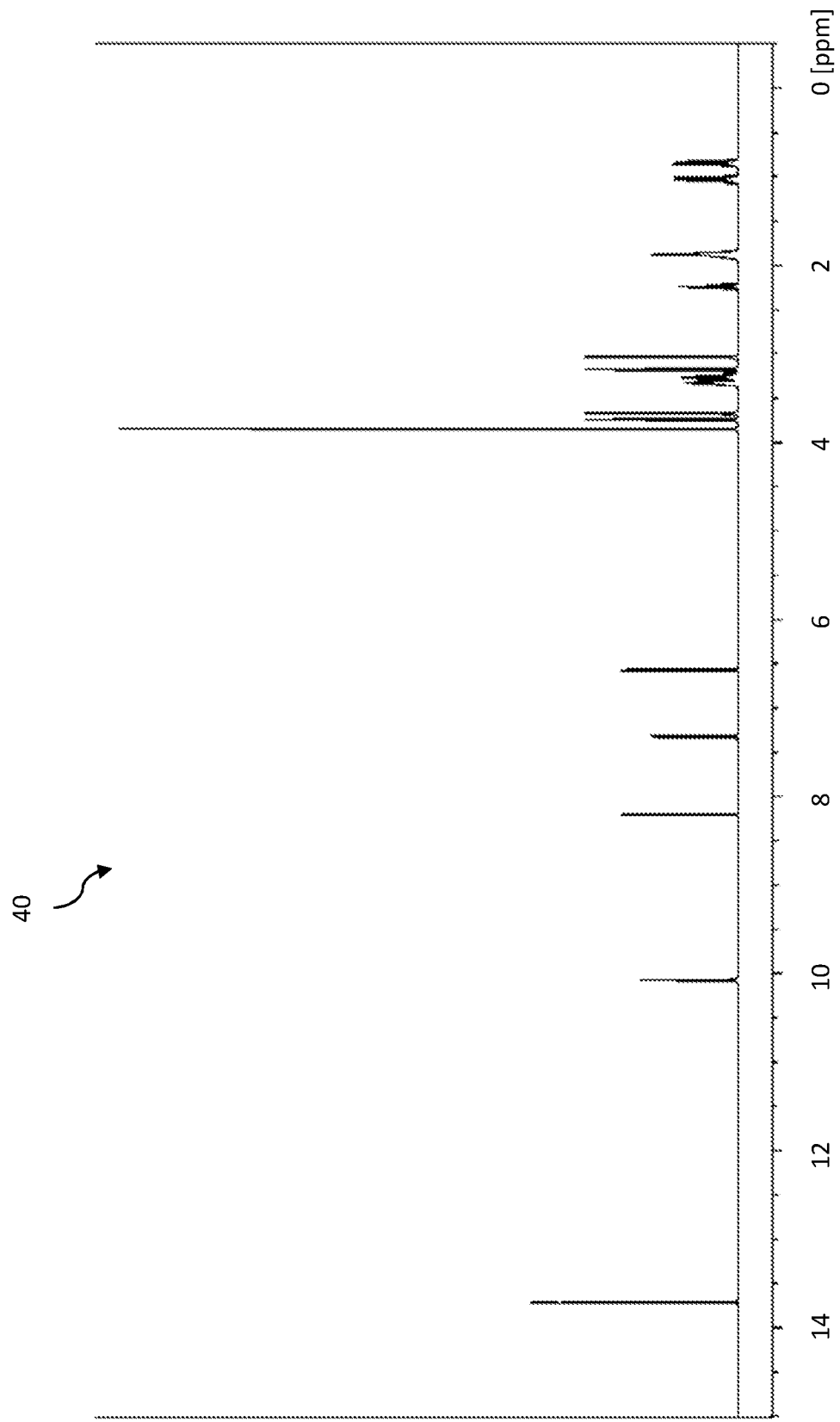
FIG. 4 is an example of a computed raw spectrum for an active molecule.

The raw spectrum generator module 212 can compute a particular raw spectrum by estimating the spin system of the associated NMR active molecule and a subsequent numerical solution of the Schroedinger equation for a given pulse sequence. This allows, for example, simulation of cyclosporine A spectrum (89 protons, 56 particles) and with X-approximation also much larger spin-networks like testosterone (28 fully coupled protons). FIG. 4 shows an example of a computed raw spectrum 40 in the range from 0 ppm to 15 ppm where the computed raw spectrum 40 was generated under the assumption of a line width of 0.6 Hz. Each raw spectrum is associated with a different active molecule having a known number of protons #P. The number of protons #P is known from the respective structural formulas. For example, the structural formula 30 (cf. FIG. 3) includes 28 protons as evident for a person skilled in the art. The current spectra which are shown in the example figures FIG. 4 to FIG. 11 are actually computed for the structure formula shown in FIG. 3.

The computed NMR raw spectra 213 together with the respective number of known protons #P are now obtained 1100 by the computer system 100 serving as input to a line broadening module 110 of the computer system 100. In one implementation, the line broadening module (or a separate pre-processing module) may perform an initial pre-processing 1150 of the obtained raw spectra so that the number of data points in each raw spectrum approximately corresponds to the number of data points of a comparable real-world NMR spectrum obtained from a real-world NMR experiment, e.g. powers of two like 512, 1024, 32768. To achieve a match between the number of data points of a test input spectrum and the number of data points of the current spectra of the training data set, the test input may be interpolated accordingly before being processed by the neural network.

Figure 5:
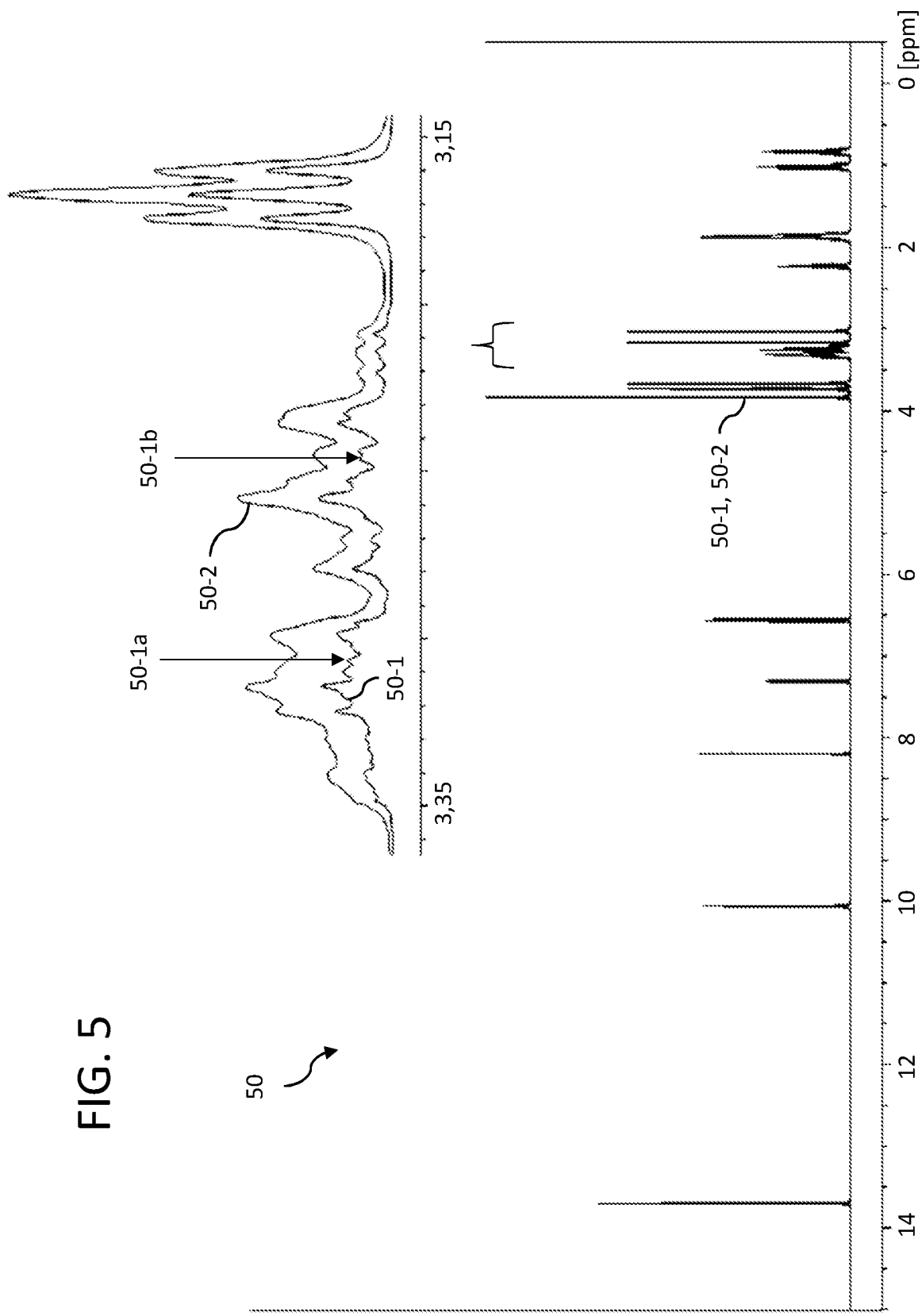
FIG. 5 is an example of a broadened spectrum according to an embodiment.

The line broadening module 110 generates a broadened spectrum 111 as a current spectrum for each raw spectrum by broadening 1200 peaks of the raw spectra by convolution of each raw spectrum 213 with one or more line shaping functions. The one or more line shaping functions may be a Lorentzian or Gaussian function or a combination thereof (which is equivalent to a line broadening with a Voigt function). The broadening of line widths follows a statistical distribution over the plurality of raw/current spectra. In other words, different raw spectra are broadened using different line broadening parameters where a particular line broadening parameter for the broadening of a particular raw spectrum is selected from a predefined parameter range in accordance with a statistical distribution that has a positive lower bound of the support, such as for example a gamma distribution, a beta distribution, a log-normal distribution or another suitable distribution that has a non-negative lower bound of the support. FIG. 5 illustrates an example where the raw spectrum 40 (cf. FIG. 4) was convoluted with a Lorentz function (with a width of 0.6 Hz) and a Gaussian function (with a width of 0.3 Hz) resulting in the broadened spectrum 50-2 (cf. FIG. 5). For example, in case of a raw spectrum with 0.6 Hz linewidth, a Lorentzian function with a 0.4 Hz linewidth and a Gaussian function with a 0.3 Hz linewidth may be used for line broadening. The applied line broadening parameter values in this example are therefore 0.4 Hz and 0.3 Hz, respectively.

In the entire spectrum it appears, as if the original raw spectrum 50-1 is identical to the broadened spectrum 50-2 because the differences between the two spectra are too small to be recognized by the human eye in a black and white representation without applying zooming. In the upper part of FIG. 5, a zoomed part of the spectra is illustrated in the range from 3.15 ppm to 3.35 ppm where the spectra have been shifted apart in the vertical axis for better visibility. In the zoomed view, the effect of the broadening step becomes clearly visible. The raw spectrum 50-1 has—especially when looking at peaks with low amplitudes 50-1a, 50-1b—significantly sharper peaks which almost disappear in the broadened spectrum 50-2. Due to line broadening the peak to valley ratio decreases. The broadened spectra 111 are already much more comparable with a real-world NMR spectrum than the originally computed raw spectra 213.

Figure 6A:
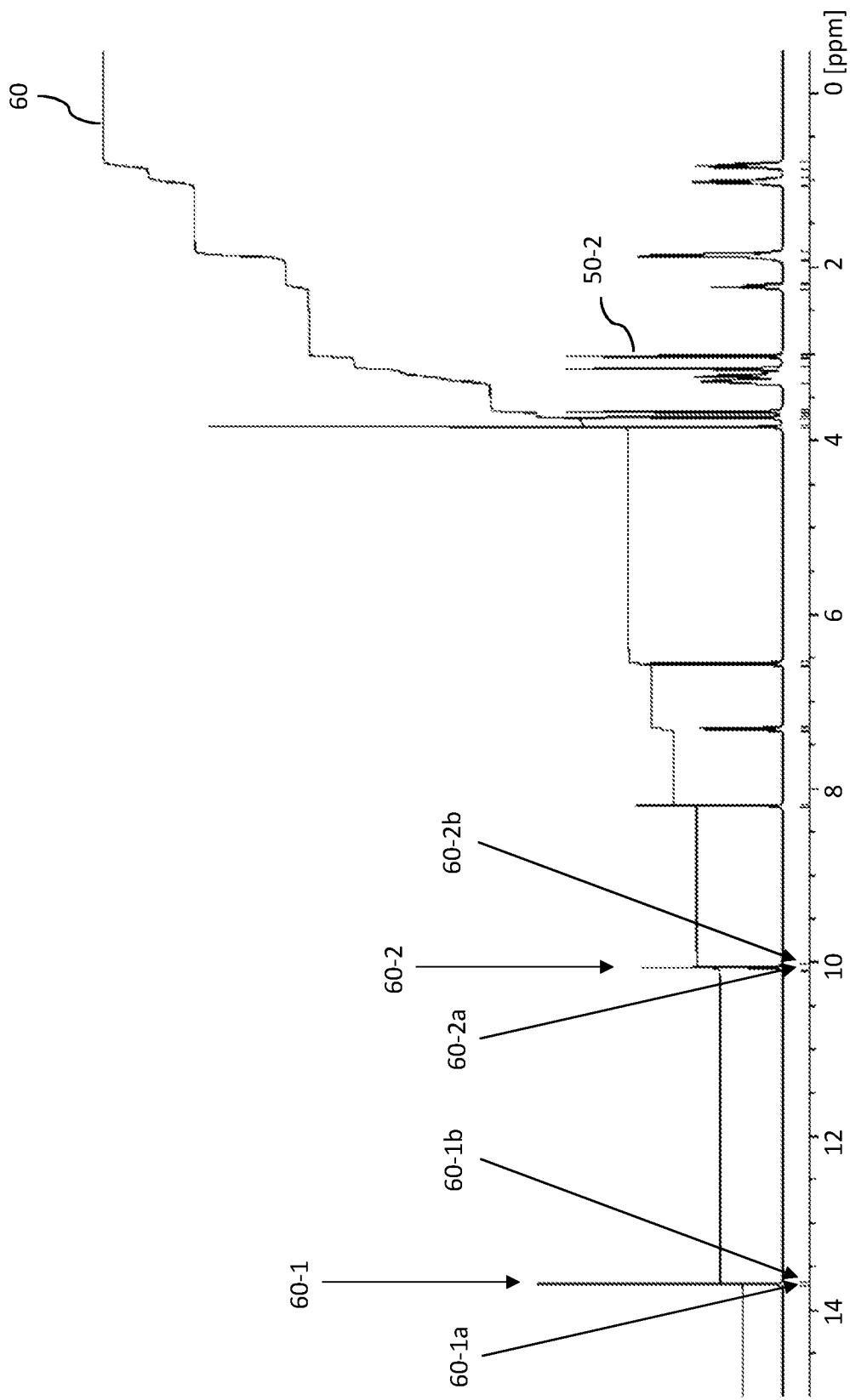
FIG. 6A illustrates an indefinite integral function applied to a broadened spectrum according to an embodiment.

Of course, as the number of protons #P is known for the raw spectrum, this number is also known for the derived broadened spectrum. The broadened spectra 111 together with their respective number of protons #P serve as input for a signal interval (SI) identifier module 120. The SI identifier 120 computes 1310 for each broadened spectrum 111 its integral function to count the number of protons associated with peaks of the respective broadened spectrum. FIG. 6A illustrates the integral function 60 which is computed for the broadened spectrum 50-2. The SI identifier 120 now analyses the integral function 60 and detects intervals in the broadened spectrum where the integral function 60 increases approximately by multiples of the value associated with a single proton. The dashes on the ppm-axis (e.g., 60-1a, 60-1b, 60-2a, 60-2b) represent the count for the number of protons associated with the respective peaks (e.g., 60-1, 60-2). In other words, the peak integral for peak 60-1 corresponds to the equivalent of two protons. Also the peak integral for peak 60-2 corresponds to the equivalent of two protons. The integral function 60 is scaled over the entire spectrum to lead to a total number of counted protons which matches the known number of protons #P of the associated molecule. Signal intervals are now identified 1320 as such intervals in the broadened spectrum 111 where the integral function increases approximately by multiples of the value associated with a single proton. Thereby, the identified intervals 121 are adjusted to cover at least a predefined threshold value of corresponding peak integrals. For example, the predefined threshold value may be defined so that 95% of the respective peak integral are covered. Higher coverage values may also be used.

Figure 6B:
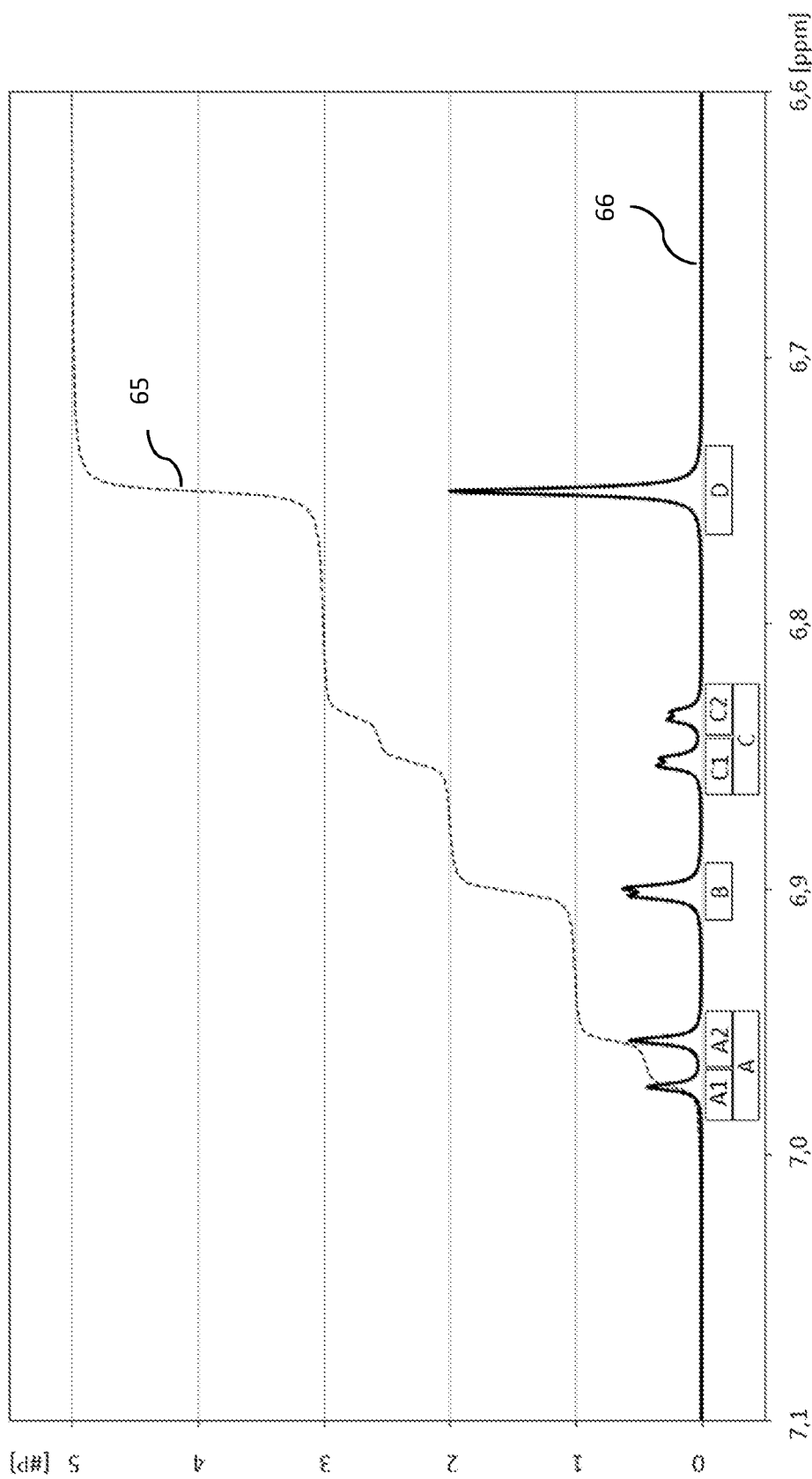
FIG. 6B illustrates a schematic picture of an indefinite integral function for an active molecule with 5 protons.

FIG. 6B, illustrates a schematic view of an integral function 65 computed for a broadened spectrum for an active molecule with 5 protons. The y-axis shows the value of the indefinite integral in equivalents of protons (#P). In this example embodiment, the signal intervals are determined using a three-step computation. In a first step, the broadened spectrum is convoluted with a rectangular window function having a width of 7 Hz. Intervals which exceed a predefined threshold value in the convoluted (further broadened) spectrum 66 define intermediate signal intervals. Such intermediate signal intervals are illustrated for the two peaks on the left (with intermediate intervals A1, A2), the next two peaks (intermediate interval B), followed by four peaks (intermediate intervals C1, C2), each associated with one proton, and one peak (intermediate interval D) on the right of the spectrum associated with 2 protons. It is to be noted, that multiple peaks associated with a single proton are typical characteristics of liquid state 1H NMR spectra making the identification of signal intervals a difficult and error prone task in NMR spectrum analysis prior art solutions. In a second step, neighboring intervals are merged in case that the indefinite integral does not get close to a multiple of a single proton anywhere between the intermediate signal intervals. In the example of FIG. 6B, this is the case for the two intermediate intervals A1 and A2 on the left (merged into A) and the two intermediate signal intervals C1 and C2 (merged into C). In a third step, these modified intermediate signal intervals are adjusted to cover, for example, 95% of the integral area for the respective peaks. This embodiment allows a reliable identification of single intervals even in cases where a signal peak does not come back to the zero line because of overlaps with neighboring peaks. It is to be noted that the computed signal peaks never come back to the zero line but actually have an infinite tail. As a consequence, the determined integral values do not show the full multiples of proton equivalents but only come close to those multiples. For example, for the interval D the computed integral value in the corresponding initially determined intermediate interval sections may only sum up to 1.8. As this value corresponds to approximately two protons, the merged interval is then adjusted to cover, for example, 95% of the area corresponding to two proton equivalents (i.e. to 1.9 proton equivalents).

Figure 7:
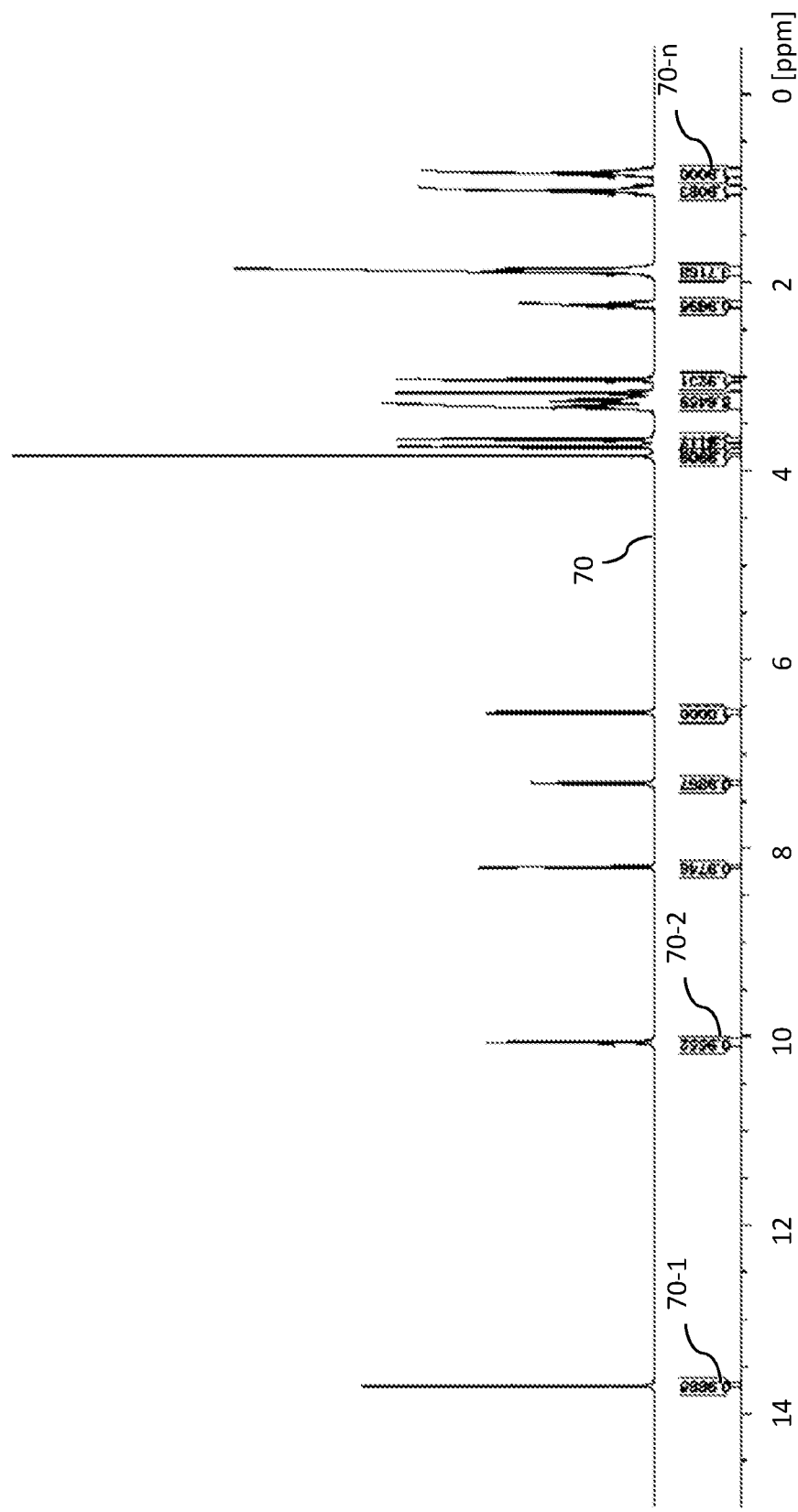
FIG. 7 illustrates a labelled broadened spectrum with signal interval labels according to an embodiment.

It is to be noted that the signal intervals 121 are determined without any further perturbations of the broadened spectra. The identified signal intervals 121 which are associated with the respective broadened spectra 111 are represented by corresponding labels. FIG. 7 illustrates an example of a broadened spectrum 70 and its associated labels 70-1 to 70-n. Thereby, each label includes the information about the respective start and end ppm-value of the signal region associated with the corresponding peak.

The broadened spectra 111, being the current spectra at this point in time, are then provided 1500 together with the associated labels for the identified signal intervals 121 as the training data set 141 to the neural network 230.

Figure 12:
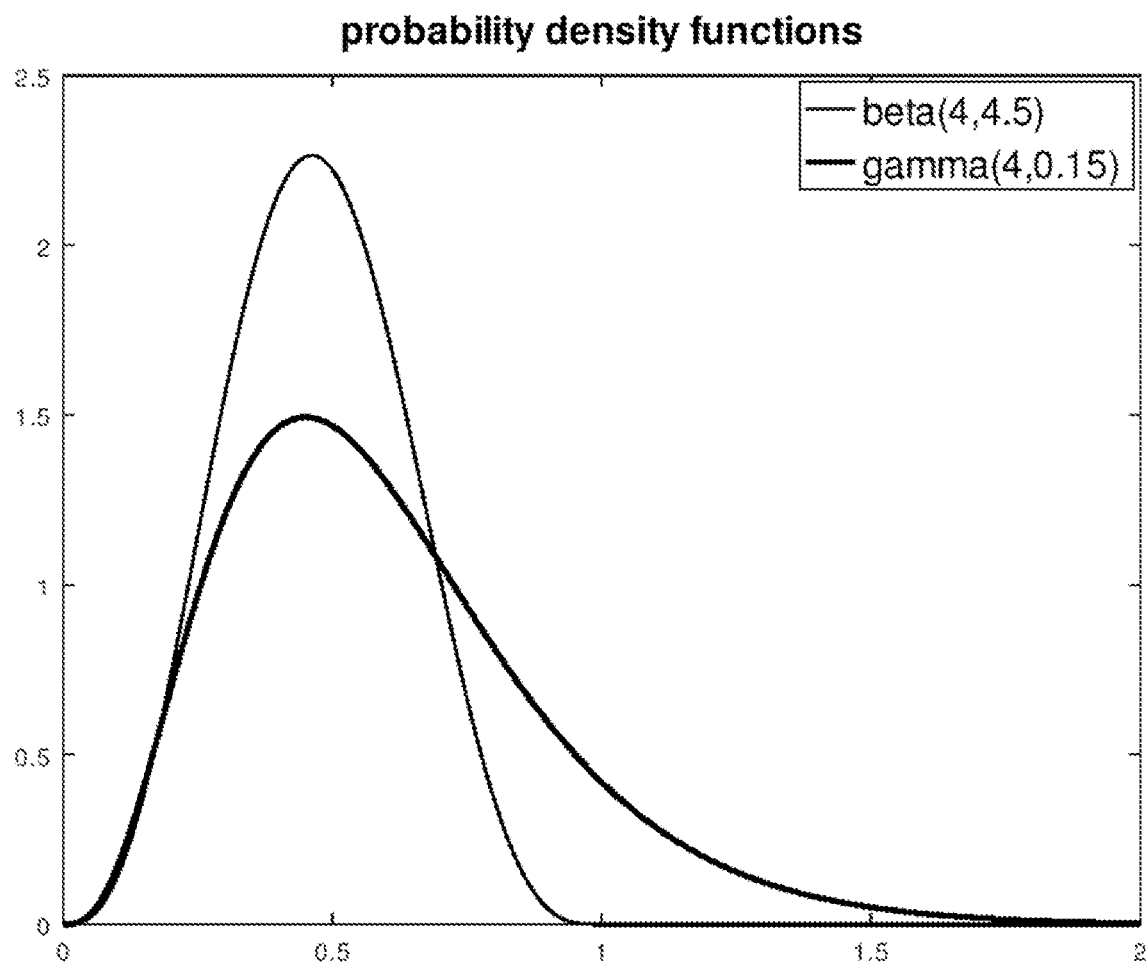
FIG. 12 illustrates examples of a gamma and a beta distribution which can be used by various embodiments.

In one embodiment, the computer system 100 further includes a statistical modifier module 130 providing one or more statistical modifier functions. Each modifier function relates to a modification which is typically observed in a real-world NMR spectrum as a perturbation of the respective spectrum (e.g., noise, baseline, etc.). Once the signal intervals have been determined for the broadened spectra, the resulting current spectra can be transformed into even more realistic spectra by applying 1400 computed perturbations which correspond to such perturbations that occur in real-world NMR experiments. For this purpose, the statistical modifier 130 applies 1400 statistical modifications to each current spectrum. Thereby, the statistical parameter of a particular statistical modification which relates to a corresponding characteristics of a real-world NMR spectrum is statistically distributed over the plurality of current spectra. Typical distributions which can be used for the statistical distribution used for line broadening are Gamma and Beta distributions. Possible choices for distributions of the line broadening parameters are shown in FIG. 12. For other types of modifications other statistical distributions may be advantageously used, such as for example uniform distributions in the cases of base line or phase shift modification. In other words, a particular current spectrum is modified by adding the computed impact of the respective perturbation to that current spectrum. To generate a training data set from which the neural network 230 can generalize, the modification for a particular parameter applied to the various current spectra is varied over all spectra in accordance with a predefined statistical distribution that is appropriate to reflect the entire range of parameter values which may be expected in real-world NMR experiments obtained with a variety of different NMR spectrometers.

The computed perturbations may include the adding 1410 of the effect of impurities 131 to each current spectrum, applying 1420 a linear phase shift 132 to each current spectrum, adding 1430 a baseline variation 133 to each current spectrum, and adding 1440 noise 134 to each current spectrum.

Figure 8:
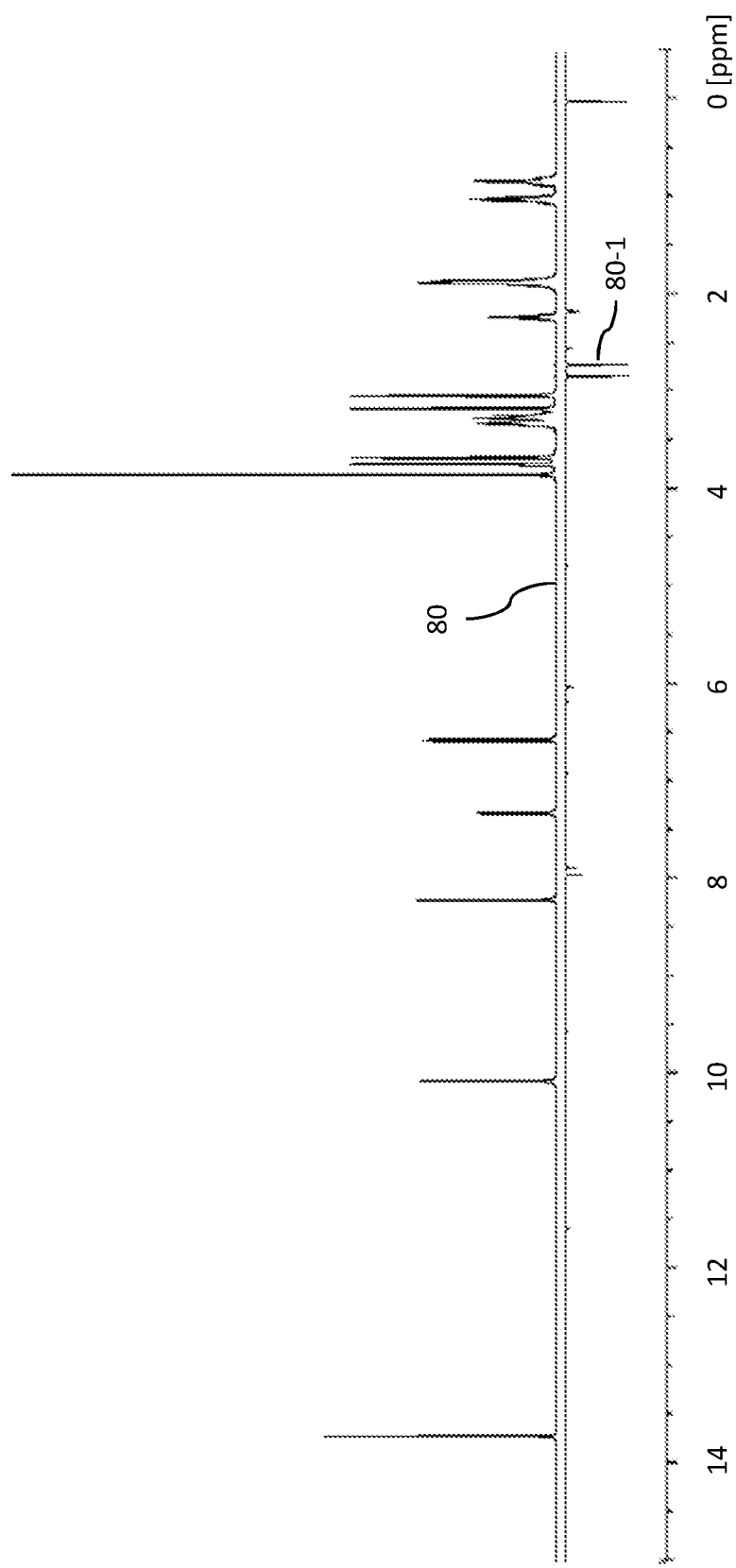
FIG. 8 illustrates the impact of impurities on a current spectrum according to an embodiment.

FIG. 8 shows an example illustrating the impact of impurities on a current spectrum according to an embodiment. The current spectrum 80 is the spectrum which is obtained after the computed effect of impurities was added. The effect is basically not visible for the human eye at the resolution used in FIG. 8. For this reason, the computed effect is illustrated in a magnified difference spectrum 80-1 underneath the modified current spectrum 80. The difference spectrum 80-1 thereby shows the difference between the original broadened spectrum and the current spectrum 80 which results from adding the impurity perturbations. The impurities may be statistically selected from a list of known impurities and from unknown/constructed impurities. In the example, Tetramethylsilan (TMS) with the structural formula $Si(CH_3)_4$ in addition to 12 random multiplets were used as impurities. In case of known impurities the NMR response of such impurities is well known and can be retrieved from corresponding databases. In case of random impurities, clusters of small perturbation signal lines are inserted into the current spectrum where the positions (frequencies) in the spectrum are randomly chosen. For computing the effect of impurities to the current spectra, the corresponding shift and the amplitude of the perturbation signals are statistically varied over the plurality of current spectra. For each particular current spectrum 111' the impurity contribution to the integral stays below the integral equivalent of 0.5 protons. This way it is avoided that the addition of the impurity effect could lead to new signal intervals.

Figure 9:
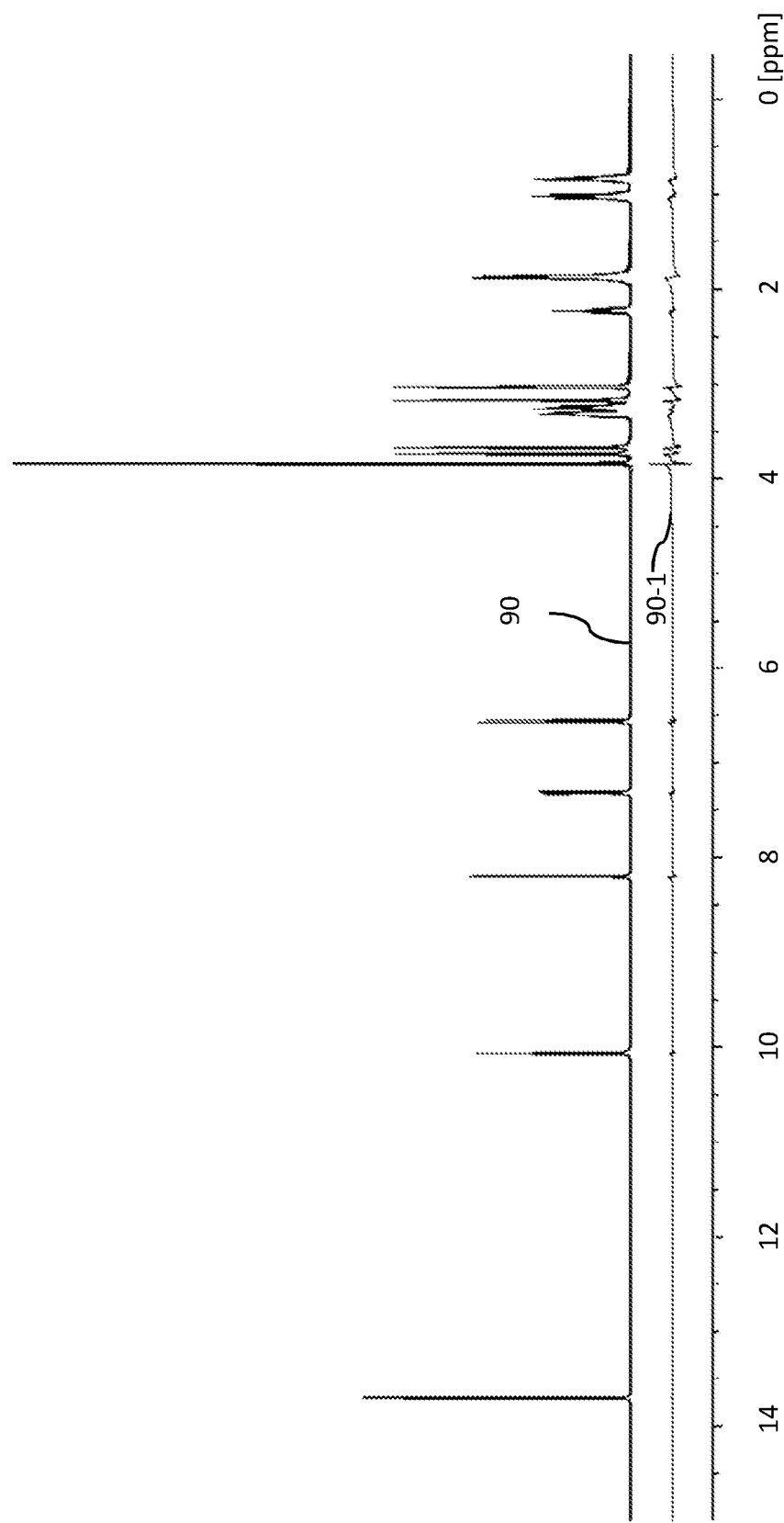
FIG. 9 illustrates the impact of phase shift on a current spectrum according to an embodiment.

FIG. 9 illustrates the impact of a phase shift perturbation on a current spectrum 90 according to an embodiment. The current spectrum 90 is the spectrum which is obtained after the effect of the phase shift was added. The effect is hardly visible for the human eye at the resolution used in FIG. 9. For this reason, the effect of the phase shifting is illustrated in a magnified difference spectrum 90-1 underneath the modified current spectrum 90 which illustrates the difference between the current spectrum before the application of the phase shift perturbation and the current spectrum 90 resulting from adding the phase shift perturbation.

In the applied phase shift model it is assumed that it only includes a term of zero order and a term of first order. The coefficients of the terms are again subject to a statistical distribution which typically results in a phase shift of maximal four degrees over the entire range of the spectrum. The real part of the phased NMR signal can be described by:

$$S(\delta)=\cos(\alpha)*A(I(\delta))-\sin(\alpha)*D(I(\delta))$$

with A being the absorption spectrum (i.e., the real part of the spectrum before the phase shift is applied) and D being the dispersion spectrum (i.e., the imaginary part, respectively). The phase a depends linearly on the chemical shift $\delta$: $\alpha=a+b*\delta$, with a and b being the phase shift parameters which are sampled from said uniform distributions.

For each active molecule, and therefore for each associated current spectrum, the linear phase shift is computed and applied in accordance with a given statistical distribution (e.g., a uniform distribution). Because of the statistical variation of the coefficients over all current spectra it is sufficient to have only one current spectrum for a given combination of coefficients in the training dataset because the neural network can already learn a generalization for the phase shift perturbation from such a training data set. This avoids an exponential growth of the number training spectra. The statistical variance results from the distribution of the phase shift over the plurality current spectra.

For example, the statistical variation may be based on a uniform distribution with a zero order phase shift of [−2, +2] degrees/ppm and a first order phase shift of [−⅕, +⅕] degrees/ppm. That is, in the extreme case when the zero order phase shift equals +2 degrees/ppm and the second order phase shift is +⅕ degrees/ppm, the phase is 2 degrees at 5 ppm (chosen pivot point) and 2+(15−5)*⅕=4 degrees at 15 ppm. In other words the maximal possible phase shift which can occur in the spectrum is 4 degrees in this example.

Figure 10:
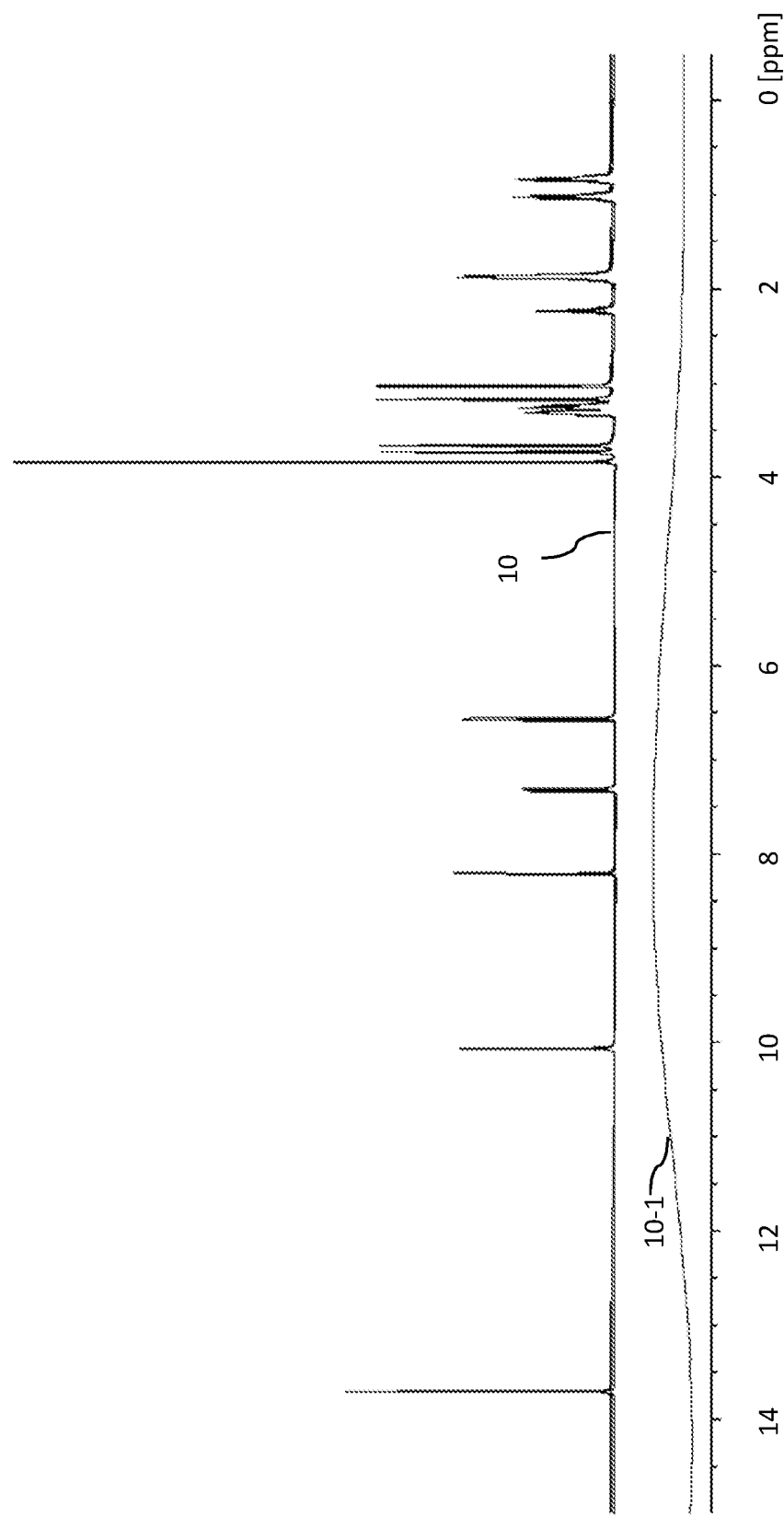
FIG. 10 illustrates the impact of baseline variation on a current spectrum according to an embodiment.

FIG. 10 illustrates the impact of a baseline variation on a current spectrum 10 according to an embodiment. The current spectrum 10 is the spectrum which is obtained after the effect of the baseline variation was added 1430. The effect is hardly visible for the human eye at the resolution used in FIG. 10. For this reason, the computed effect is illustrated in a magnified baseline spectrum 10-1 underneath the modified current spectrum 10. The baseline spectrum corresponds to the difference between the current spectrum before applying the modification and the modified current spectrum 10 after the modification. In the example, the baseline variation for the current spectrum 10 was computed with a spline function having four sampling points. The coordinates of the sampling points of the spline functions for all current spectra are statistically evenly distributed over the plurality of current spectra. Thereby, the x-coordinate is distributed over the entire spectral range and the y-coordinates are distributed over a predefined range with positive and negative values. A cubic spline, as an example of a piece-wise polynomial function, is then used for interpolation through the sampling points assigned to the respective current spectrum in accordance with the distribution.

Figure 11:
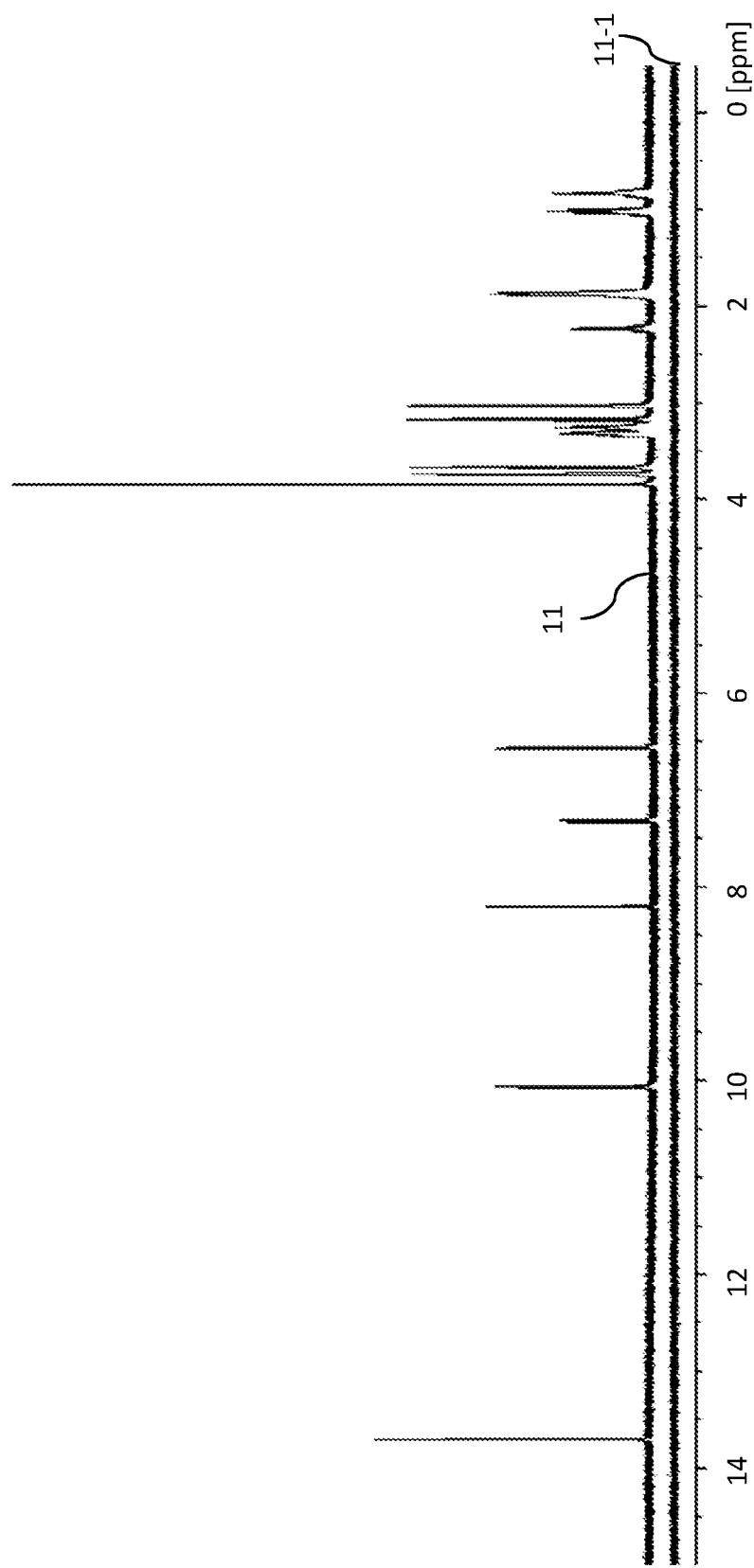
FIG. 11 illustrates the impact of noise on a current spectrum according to an embodiment.

FIG. 11 illustrates the impact of noise on a current spectrum 11 according to an embodiment. In the example, the noise spectrum 11-1 is added 1440 to the current spectrum and results in the modified current spectrum 11. The noise amplitudes follow a Gaussian distribution over all current spectra, and the standard deviation of the Gaussian distribution statistically varies over the plurality of current spectra.

It is to be noted, that the accuracy of the neural network 230 for the correct identification of signal intervals in real-world NMR spectra significantly improves when applying at least the noise perturbation to the broadened spectra. A further significant improvement can be achieved by adding the baseline perturbation.

FIG. 12 illustrates examples of probability density functions which may be used as statistical distributions by embodiments of the invention (e.g., for sampling of the line broadening parameters). The gamma distribution example is shown with a bold line and uses shape parameter 4 and scale parameter 0.15. The beta distribution example uses shape parameter 4 and scale parameter 4.5. When using such distributions for the statistical variations applied by the statistical modifier functions as described (for adding perturbations), the neural network learns from this training data set to generalize in such a way that signal intervals can be reliably recognized in NMR spectra obtained from real-world NMR experiment with a high degree of accuracy. However, other shape and scale parameters may be used, too.

Turning back to FIGS. 1 and 2, the computer-implemented method for generating the training dataset 141 can be continued by a further computer-implemented method 1600 for training the neural network 230 for signal analysis in NMR spectra. The trained neural network 230 is thereby enabled to identify signal intervals in real-world NMR spectra obtained from real-world NMR experiments. For this purpose, the spectrum analyzer 102, which includes the neural network 230 to be trained, receives 1610 the training data set 141 with the labels 121 for the identified signal intervals. The neural network is then trained 1620 with the received training data set and the associated label identifiers 121 using a supervised learning method. Thereby, the training input to the neural network 230 are the received current spectra 111' of the training data set 141 and the outputs are the respective signal intervals. The outputs can be compared to the received labels 121 and the weights in the neural network are adjusted accordingly.

Once the neural network has been trained 1600, it can be used by the spectrum analyzer 102 for executing a further computer implemented method 1700 for signal analysis in NMR spectra. Initially, the spectrum analyzer 102 receives 1710 a real-world NMR spectrum 202 obtained from a real-world NMR experiment as test input for the trained neural network 230. The spectrum analyzer 102 applies 1720 the trained neural network 230 to said test input 202. The output of the trained neural network 230 includes one or more signal intervals 203 as identified by the trained neural network 230. This output is then provided 1730 by the signal analyzer 102 to a user or to another analysis module for further evaluation.

Figure 13:
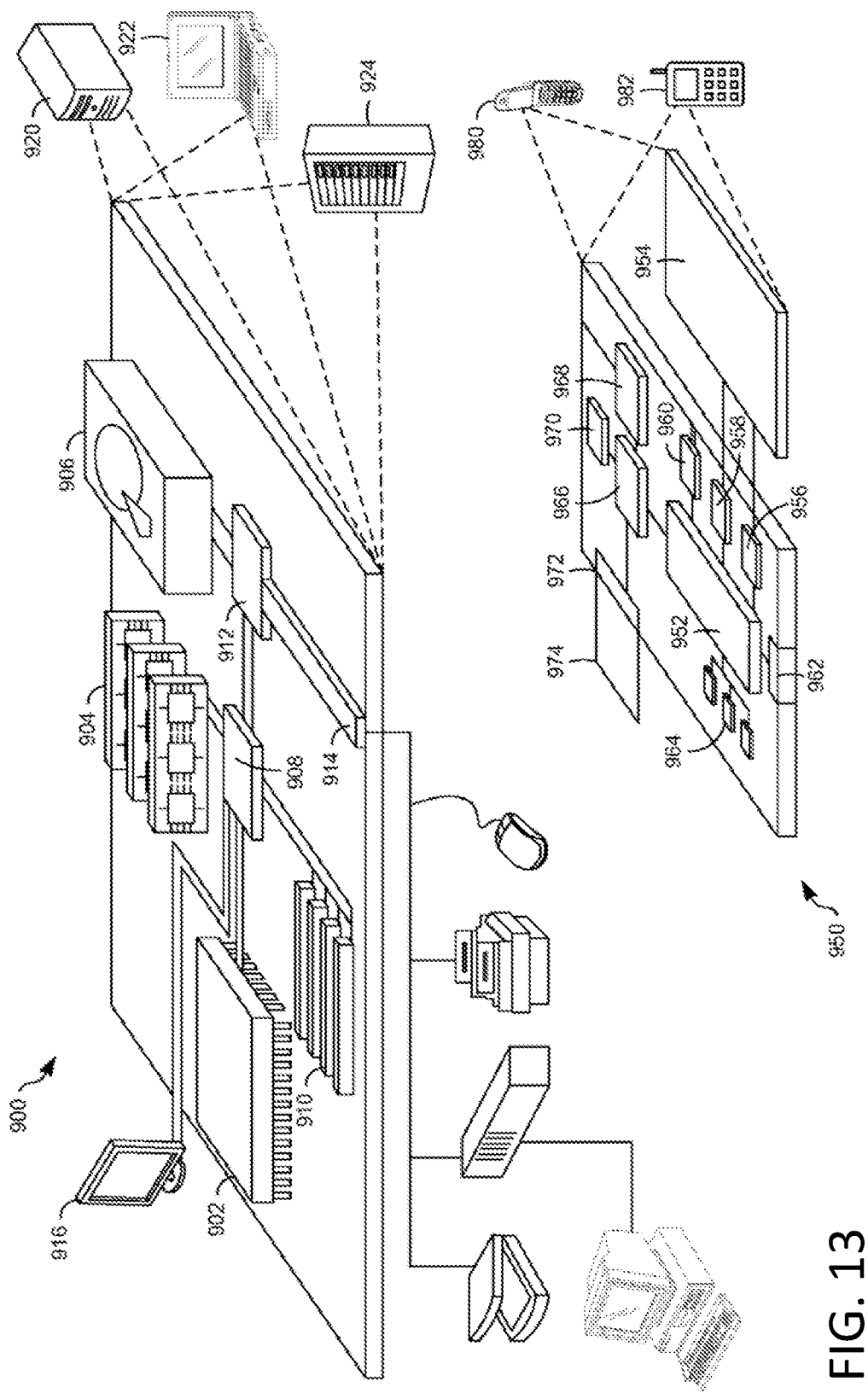
FIG. 13 is a diagram that shows an example of a generic computer device and a generic mobile computer device which may be used with the techniques described herein.

FIG. 13 is a diagram that shows an example of a generic computer device 900 and a generic mobile computer device 950, which may be used with the techniques described here. In some embodiments, computing device 900 may relate to the system 100 (cf. FIG. 1). Computing device 950 is intended to represent various forms of mobile devices, such as personal digital assistants, cellular telephones, smart phones, and other similar computing devices. In the context of this disclosure the computing device 950 may provide I/O means for a user to interact with the computing device 950. In other embodiments, the entire system 100 may be implemented on the mobile device 950. The components shown here, their connections and relationships, and their functions, are meant to be exemplary only, and are not meant to limit implementations of the inventions described and/or claimed in this document.

Computing device 900 includes a processor 902, memory 904, a storage device 906, a high-speed interface 908 connecting to memory 904 and high-speed expansion ports 910, and a low speed interface 912 connecting to low speed bus 914 and storage device 906. Each of the components 902, 904, 906, 908, 910, and 912, are interconnected using various busses, and may be mounted on a common motherboard or in other manners as appropriate. The processor 902 can process instructions for execution within the computing device 900, including instructions stored in the memory 904 or on the storage device 906 to display graphical information for a GUI on an external input/output device, such as display 916 coupled to high speed interface 908. In other implementations, multiple processors and/or multiple buses may be used, as appropriate, along with multiple memories and types of memory. Also, multiple computing devices 900 may be connected, with each device providing portions of the necessary operations (e.g., as a server bank, a group of blade servers, or a multi-processor system).

The memory 904 stores information within the computing device 900. In one implementation, the memory 904 is a volatile memory unit or units. In another implementation, the memory 904 is a non-volatile memory unit or units. The memory 904 may also be another form of computer-readable medium, such as a magnetic or optical disk.

The storage device 906 is capable of providing mass storage for the computing device 900. In one implementation, the storage device 906 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 904, the storage device 906, or memory on processor 902.

The high speed controller 908 manages bandwidth-intensive operations for the computing device 900, while the low speed controller 912 manages lower bandwidth-intensive operations. Such allocation of functions is exemplary only. In one implementation, the high-speed controller 908 is coupled to memory 904, display 916 (e.g., through a graphics processor or accelerator), and to high-speed expansion ports 910, which may accept various expansion cards (not shown). In the implementation, low-speed controller 912 is coupled to storage device 906 and low-speed expansion port 914. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 900 may be implemented in a number of different forms, as shown in the figure. For example, it may be implemented as a standard server 920, or multiple times in a group of such servers. It may also be implemented as part of a rack server system 924. In addition, it may be implemented in a personal computer such as a laptop computer 922. Alternatively, components from computing device 900 may be combined with other components in a mobile device (not shown), such as device 950. Each of such devices may contain one or more of computing device 900, 950, and an entire system may be made up of multiple computing devices 900, 950 communicating with each other.

Computing device 950 includes a processor 952, memory 964, an input/output device such as a display 954, a communication interface 966, and a transceiver 968, among other components. The device 950 may also be provided with a storage device, such as a microdrive or other device, to provide additional storage. Each of the components 950, 952, 964, 954, 966, and 968, are interconnected using various buses, and several of the components may be mounted on a common motherboard or in other manners as appropriate.

The processor 952 can execute instructions within the computing device 950, including instructions stored in the memory 964. The processor may be implemented as a chipset of chips that include separate and multiple analog and digital processors. The processor may provide, for example, for coordination of the other components of the device 950, such as control of user interfaces, applications run by device 950, and wireless communication by device 950.

Processor 952 may communicate with a user through control interface 958 and display interface 956 coupled to a display 954. The display 954 may be, for example, a TFT LCD (Thin-Film-Transistor Liquid Crystal Display) or an OLED (Organic Light Emitting Diode) display, or other appropriate display technology. The display interface 956 may comprise appropriate circuitry for driving the display 954 to present graphical and other information to a user. The control interface 958 may receive commands from a user and convert them for submission to the processor 952. In addition, an external interface 962 may be provide in communication with processor 952, so as to enable near area communication of device 950 with other devices. External interface 962 may provide, for example, for wired communication in some implementations, or for wireless communication in other implementations, and multiple interfaces may also be used.

The memory 964 stores information within the computing device 950. The memory 964 can be implemented as one or more of a computer-readable medium or media, a volatile memory unit or units, or a non-volatile memory unit or units. An expansion memory may also be provided and connected to device 950 through expansion interface 982, which may include, for example, a SIMM (Single In Line Memory Module) card interface. Such expansion memory may provide extra storage space for device 950, or may also store applications or other information for device 950. Specifically, an expansion memory may include instructions to carry out or supplement the processes described above, and may include secure information also. Thus, for example, such an expansion memory may act as a security module for device 950, and may be programmed with instructions that permit secure use of device 950. In addition, secure applications may be provided via the SIMM cards, along with additional information, such as placing the identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 964, an expansion memory, or memory on processor 952, that may be received, for example, over transceiver 968 or external interface 962.

Device 950 may communicate wirelessly through communication interface 966, which may include digital signal processing circuitry where necessary. Communication interface 966 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 968. In addition, short-range communication may occur, such as using a Bluetooth, WiFi, or other such transceiver (not shown). In addition, GPS (Global Positioning System) receiver module 980 may provide additional navigation- and location-related wireless data to device 950, which may be used as appropriate by applications running on device 950.

Device 950 may also communicate audibly using audio codec 960, which may receive spoken information from a user and convert it to usable digital information. Audio codec 960 may likewise generate audible sound for a user, such as through a speaker, e.g., in a handset of device 950. Such sound may include sound from voice telephone calls, may include recorded sound (e.g., voice messages, music files, etc.) and may also include sound generated by applications operating on device 950.

The computing device 950 may be implemented in a number of different forms, as shown in the figure. For example, it may be implemented as a cellular telephone 980. It may also be implemented as part of a smart phone 982, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing device that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing device can include clients and servers. A client and server are generally remote from each other and typically interact through a communication network. The relationship of client and server arises by virtue of computer programs running on the respective computers and having a client-server relationship to each other.

The invention claimed is:

1. A computer-implemented method for generating a training data set and training a neural network for signal analysis in Nuclear Magnetic Resonance (NMR) spectra, comprising:
 obtaining a plurality of computed NMR raw spectra, each computed NMR raw spectrum being associated with a different NMR active molecule having a known number of protons (#P);
 broadening line widths of the plurality of computed NMR raw spectra by convolution of each computed NMR raw spectrum with one or more line shaping functions to generate a broadened spectrum as a current spectrum for each computed NMR raw spectrum, wherein the broadening of the line widths follows a statistical distribution over a plurality of current spectra by sampling respective broadening values for the plurality of computed NMR raw spectra from the statistical distribution;
 computing for each broadened spectrum an integral function to count a number of protons associated with peaks of a respective broadened spectrum;
 identifying signal intervals as intervals in the broadened spectrum where the integral function increases approximately by multiples of a value associated with a single proton so that a total number of counted protons matches the known number of protons (#P) of an associated molecule, wherein the identified signal intervals are adjusted to cover at least a predefined threshold value of corresponding peak integrals; and
 using the plurality of current spectra with associated labels for the identified signal intervals as the training data set to train the neural network.

2. The computer-implemented method of claim 1, wherein a molecular weight of associated NMR active molecules is smaller or equal to 500 Dalton.

3. The computer-implemented method of claim 1, further comprising:
 upon having received the plurality of computed NMR raw spectra, pre-processing the received plurality of computed NMR raw spectra so that a number of data points in each computed NMR raw spectrum approximately corresponds to the number of data points of a comparable real-world NMR spectrum obtained from a real-world NMR experiment.

4. The computer-implemented method of claim 1, wherein the one or more line shaping functions are selected from a group of: Lorentzian, Gaussian and Voigt functions.

5. The computer-implemented method of claim 1, wherein the statistical distribution used for broadening is selected form a group of: gamma distribution, beta distribution, and log-normal distribution.

6. The computer-implemented method of claim 5, wherein line broadening values are equivalent to a range from 0.3 Hz to 0.6 Hz.

7. The computer-implemented method of claim 1, further comprising:
 after having identified the signal intervals, applying one or more statistical modifications to each current spectrum wherein statistical parameters of a particular statistical modification are statistically distributed over the plurality of current spectra.

8. The computer-implemented method of claim 1, further comprising:
 after having identified the signal intervals, adding an effect of impurities to the plurality of current spectra wherein a number of impurities, a corresponding shift and an amplitude are statistically varied over the plurality of current spectra so that an impurity contribution to an integral of a particular current spectrum stays below an integral equivalent of 0.5 protons per impurity.

9. The computer-implemented method of claim 1, further comprising:
 after having identified the signal intervals, applying a linear phase shift to each current spectrum wherein applied linear phase shifts are statistically distributed over the plurality of current spectra.

10. The computer-implemented method of claim 1, further comprising:
 after having identified the signal intervals, adding a baseline variation to each current spectrum wherein the baseline variation for a particular current spectrum is computed with a piece-wise polynomial interpolation function through three to twelve sampling points referred to as knots, and wherein coordinates of the knots for the plurality of current spectra are statistically uniformly distributed over the plurality of current spectra.

11. The computer-implemented method of claim 1, further comprising:
 after having determined the signal intervals, adding noise to each current spectrum wherein noise amplitudes follow a Gaussian distribution and a standard deviation of the Gaussian distribution statistically varies over the plurality of current spectra.

12. The computer-implemented method of claim 1, further comprising:
 receiving the training data set; and
 training the neural network with the plurality of current spectra of the training data set and the associated labels using a supervised learning method wherein training input to the neural network include the plurality of current spectra of the training data set and outputs include respective signal intervals.

13. The computer-implemented method of claim 12, further comprising:
 receiving a real-world NMR spectrum obtained from a real-world NMR experiment as test input for the trained neural network;
 applying the trained neural network to the test input; and
 providing as output of the trained neural network one or more signal intervals as identified by the trained neural network.

14. A non-transitory computer program product for generating a realistic training data set for training a neural network for signal analysis in Nuclear Magnetic Resonance (NMR) spectra, comprising instructions that when loaded into a memory of a computer system and being executed by at least one processor of the computer system cause the computer system to:
 obtain a plurality of computed NMR raw spectra, each computed NMR raw spectrum being associated with a different NMR active molecule having a known number of protons (#P);
 broaden line widths of the plurality of computed NMR raw spectra by convolution of each computed NMR raw spectrum with one or more line shaping functions to generate a broadened spectrum as a current spectrum for each computed NMR raw spectrum, wherein the broadening of the line widths follows a statistical distribution over a plurality of current spectra by sampling respective broadening values for the plurality of computed NMR raw spectra from the statistical distribution;

compute for each broadened spectrum an integral function to count a number of protons associated with peaks of a respective broadened spectrum;

identify signal intervals as intervals in the broadened spectrum where the integral function increases approximately by multiples of a value associated with a single proton so that a total number of counted protons matches the known number of protons (#P) of an associated molecule, wherein the identified signal intervals are adjusted to cover at least a predefined threshold value of corresponding peak integrals; and use the plurality of current spectra with associated labels for the identified signal intervals as the training data set to train the neural network.

15. The non-transitory computer program product of claim 14, wherein, upon receipt of the plurality of computed NMR raw spectra, the instructions, when executed, are further configured to cause the at least one processor to:

pre-process the plurality of computed NMR raw spectra so that a number of data points in each computed NMR raw spectrum approximately corresponds to the number of data points of a comparable real-world NMR spectrum obtained from a real-world NMR experiment.

16. The non-transitory computer program product of claim 14, wherein the instructions, when executed, are further configured to cause the at least one processor to:

train the neural network with the plurality of current spectra of the training data set and the associated labels using a supervised learning method wherein training input to the neural network include the plurality of current spectra of the training data set and outputs include respective signal intervals.

17. The non-transitory computer program product of claim 16, wherein the instructions, when executed, are further configured to cause the at least one processor to:

receive a real-world NMR spectrum obtained from a real-world NMR experiment as test input for the trained neural network;

apply the trained neural network to the test input; and provide as output of the trained neural network one or more signal intervals as identified by the trained neural network.

18. A computer system for generating a realistic training data set for training a neural network for signal analysis in Nuclear Magnetic Resonance (NMR) spectra, the system comprising:

at least one processor;

at least one memory configured to store instructions that are executable by the at least one processor, and which, when executed, cause the at least one processor to obtain a plurality of computed NMR raw spectra, each computed NMR raw spectrum being associated with a different NMR active molecule having a known number of protons (#P);

broaden line widths of the plurality of computed NMR raw spectra by convolution of each computed NMR raw spectrum with one or more line shaping functions to generate a broadened spectrum as a current spectrum for each computed NMR raw spectrum, wherein the broadening of the line widths follows a statistical distribution over a plurality of current spectra by sampling respective broadening values for the plurality of computed NMR raw spectra from the statistical distribution;

compute for each broadened spectrum an integral function to count a number of protons associated with peaks of a respective broadened spectrum;

identify signal intervals as intervals in the broadened spectrum where the integral function increases approximately by multiples of a value associated with a single proton so that a total number of counted protons matches the known number of protons (#P) of an associated molecule, wherein the identified signal intervals are adjusted to cover at least a predefined threshold value of corresponding peak integrals; and use the plurality of current spectra with associated labels for the identified signal interval as the training data set to train the neural network.

19. The computer system of claim 18, wherein the instructions, when executed, are further configured to cause the at least one processor to:

train the neural network with the plurality of current spectra of the training data set and the associated labels using a supervised learning method wherein training input to the neural network include the plurality of current spectra of the training data set and outputs include respective signal intervals.

20. The computer system of claim 19, wherein the instructions, when executed, are further configured to cause the at least one processor to:

receive a real-world NMR spectrum obtained from a real-world NMR experiment as test input for the trained neural network;

apply the trained neural network to the test input; and provide as output of the trained neural network one or more signal intervals as identified by the trained neural network.

* * * * *